United States Patent
Lin et al.

(10) Patent No.: US 11,271,086 B2
(45) Date of Patent: *Mar. 8, 2022

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Chih-Han Lin, Hsinchu (TW); Shih-Chang Tsai, Hsinchu (TW); Wen-Shuo Hsieh, Taipei (TW); Te-Yung Liu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/877,317

(22) Filed: May 18, 2020

(65) Prior Publication Data

US 2020/0279934 A1 Sep. 3, 2020

Related U.S. Application Data

(60) Continuation of application No. 16/383,542, filed on Apr. 12, 2019, now Pat. No. 10,658,485, which is a (Continued)

(51) Int. Cl.
*H01L 29/49* (2006.01)
*H01L 21/02* (2006.01)
(Continued)

(52) U.S. Cl.
CPC .... *H01L 29/4908* (2013.01); *H01L 21/02104* (2013.01); *H01L 21/82345* (2013.01);
(Continued)

(58) Field of Classification Search
CPC ..... H01L 21/823481; H01L 21/823431; H01L 21/845; H01L 21/823456;
(Continued)

(56) References Cited

U.S. PATENT DOCUMENTS 9,559,205 B2 1/2017 Chang et al.
9,601,567 B1 3/2017 Hsieh
(Continued)

FOREIGN PATENT DOCUMENTS

KR  10-20110121469 A  11/2011
KR  10-2016-0074859 A  6/2016
KR  10-2016-0140312 A  12/2016

OTHER PUBLICATIONS

Notice of Allowance issued in related U.S. Appl. No. 15/726,113, dated Nov. 21, 2018.
(Continued)

*Primary Examiner* — Herve-Louis Y Assouman
(74) *Attorney, Agent, or Firm* — McDermott Will & Emery LLP

(57) ABSTRACT

A semiconductor device includes plurality of fin structures extending in first direction on semiconductor substrate. Fin structure's lower portion is embedded in first insulating layer. First gate electrode and second gate electrode structures extend in second direction substantially perpendicular to first direction over of fin structures and first insulating layer. The first and second gate electrode structures are spaced apart and extend along line in same direction. First and second insulating sidewall spacers are arranged on opposing sides of first and second gate electrode structures. Each of first and second insulating sidewall spacers contiguously extend along second direction. A second insulating layer is in region between first and second gate electrode structures. The second insulating layer separates first and second gate electrode structures. A third insulating layer is
(Continued)

in region between first and second gate electrode structures. The third insulating layer is formed of different material than second insulating layer.

20 Claims, 37 Drawing Sheets

Related U.S. Application Data division of application No. 15/726,113, filed on Oct. 5, 2017, now Pat. No. 10,263,090.

(60) Provisional application No. 62/489,205, filed on Apr. 24, 2017.

(51) Int. Cl.
| | | |
|---|---|---|
| *H01L 21/8234* | (2006.01) | |
| *H01L 21/8238* | (2006.01) | |
| *H01L 21/84* | (2006.01) | |
| *H01L 27/04* | (2006.01) | |
| *H01L 27/088* | (2006.01) | |
| *H01L 29/786* | (2006.01) | |
| *H01L 51/52* | (2006.01) | |
| *H01L 27/12* | (2006.01) | |
| *H01L 29/78* | (2006.01) | |

(52) U.S. Cl.
CPC ............ *H01L 21/82385* (2013.01); *H01L 21/823431* (2013.01); *H01L 21/823437* (2013.01); *H01L 21/823456* (2013.01); *H01L 21/823481* (2013.01); *H01L 21/823821* (2013.01); *H01L 21/823828* (2013.01); *H01L 21/823842* (2013.01); *H01L 21/823864* (2013.01); *H01L 21/845* (2013.01); *H01L 27/04* (2013.01); *H01L 27/0886* (2013.01); *H01L 27/1211* (2013.01); *H01L 29/7853* (2013.01); *H01L 29/7869* (2013.01); *H01L 51/5203* (2013.01)

(58) Field of Classification Search
CPC ..... H01L 21/823437; H01L 21/823828; H01L 21/82345; H01L 21/823842; H01L 21/823821; H01L 21/02104; H01L 21/82385; H01L 21/823864; H01L 27/0886; H01L 27/1211; H01L 27/04; H01L 29/4908; H01L 29/7853; H01L 29/7869; H01L 29/66795; H01L 51/5203
See application file for complete search history.

(56) References Cited

U.S. PATENT DOCUMENTS

| | | | |
|---|---|---|---|
| 10,038,079 | B1 | 7/2018 | Ohtou et al. |
| 10,658,485 | B2* | 5/2020 | Lin ..................... H01L 27/04 |
| 2015/0206939 | A1* | 7/2015 | Huang ............... H01L 29/7848 |
| | | | 257/77 |
| 2016/0133632 | A1* | 5/2016 | Park ..................... H01L 21/845 |
| | | | 257/369 |
| 2016/0181399 | A1* | 6/2016 | Jun ................... H01L 21/28238 |
| | | | 438/294 |
| 2016/0181425 | A1* | 6/2016 | Bai ................... H01L 29/66818 |
| | | | 438/283 |
| 2016/0336320 | A1 | 11/2016 | Lin |
| 2016/0351700 | A1* | 12/2016 | Chang ................... H01L 29/165 |

OTHER PUBLICATIONS

Notice of Allowance issued in related U.S. Appl. No. 16/383,542, dated Jan. 15, 2020.

\* cited by examiner

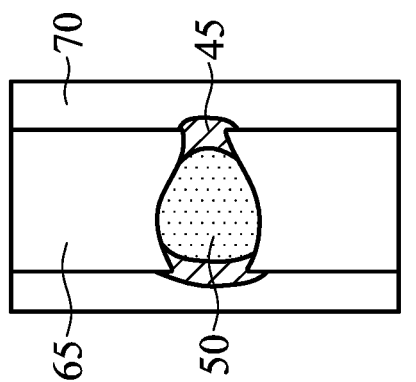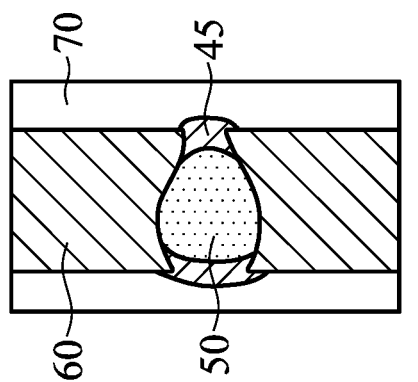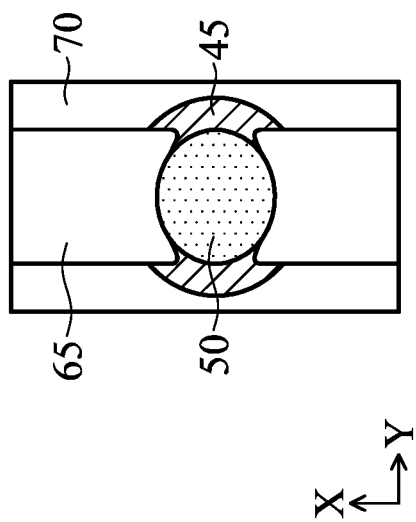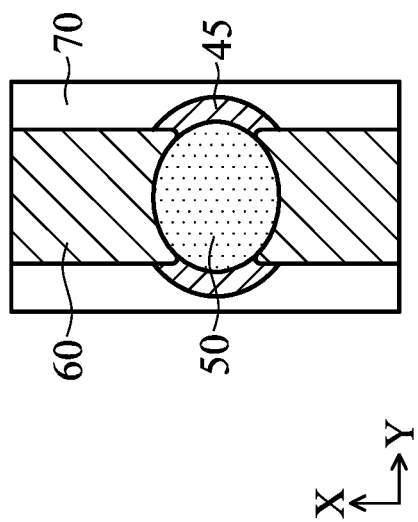

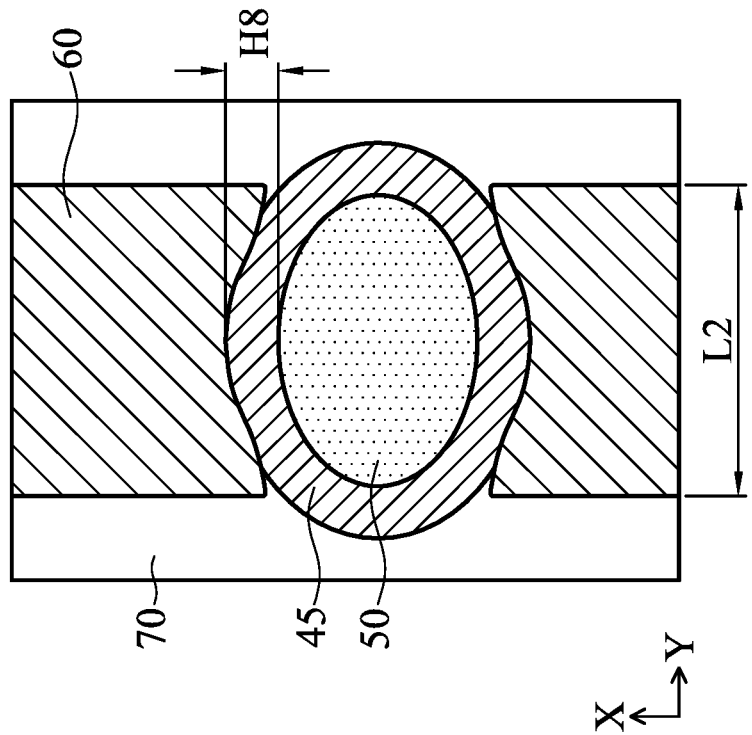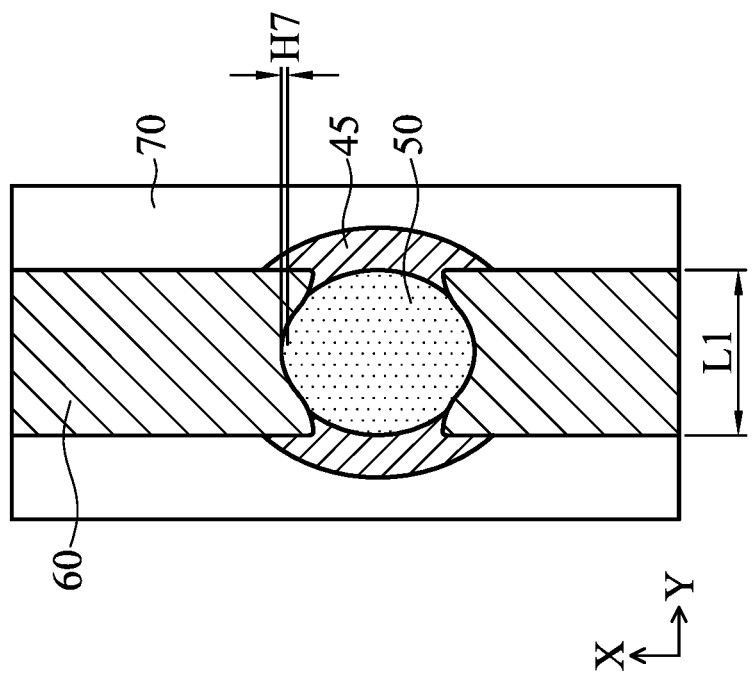

SEMICONDUCTOR DEVICE AND MANUFACTURING METHOD THEREOF

CROSS-REFERENCE TO RELATED APPLICATIONS

This application is a continuation of application Ser. No. 16/383,542, filed Apr. 12, 2019, now U.S. Pat. No. 10,658,485, which is a divisional of application Ser. No. 15/726,113, filed Oct. 5, 2017, now U.S. Pat. No. 10,263,090, which claims priority to U.S. Provisional Patent Application No. 62/489,205 filed Apr. 24, 2017, the entire disclosures of each of which are incorporated herein by reference.

TECHNICAL FIELD

The disclosure relates to semiconductor integrated circuits, and more particularly to metal gate electrodes and their manufacturing processes.

BACKGROUND

As semiconductor device size shrinks and semiconductor device density on a semiconductor wafer increases, the chance of short circuits and other defects occurring between adjacent devices increases. Electrical contact between adjacent gate electrodes can be caused by residual conductive material bridging the separation between adjacent gate electrodes when gate electrodes are cut by an etching operation. There is a need for processes and devices where bridging across adjacent gate electrodes is eliminated.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 12A, 12B, 12C, 12D, 12E, 12F, 12G, and 12H show plan views of sequential processes of sequential stages of a process for manufacturing semiconductor devices according to embodiments of the present disclosure.

FIGS. 14A and 14B show plan views of embodiments of semiconductor devices according to the present disclosure.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

Figure 1:
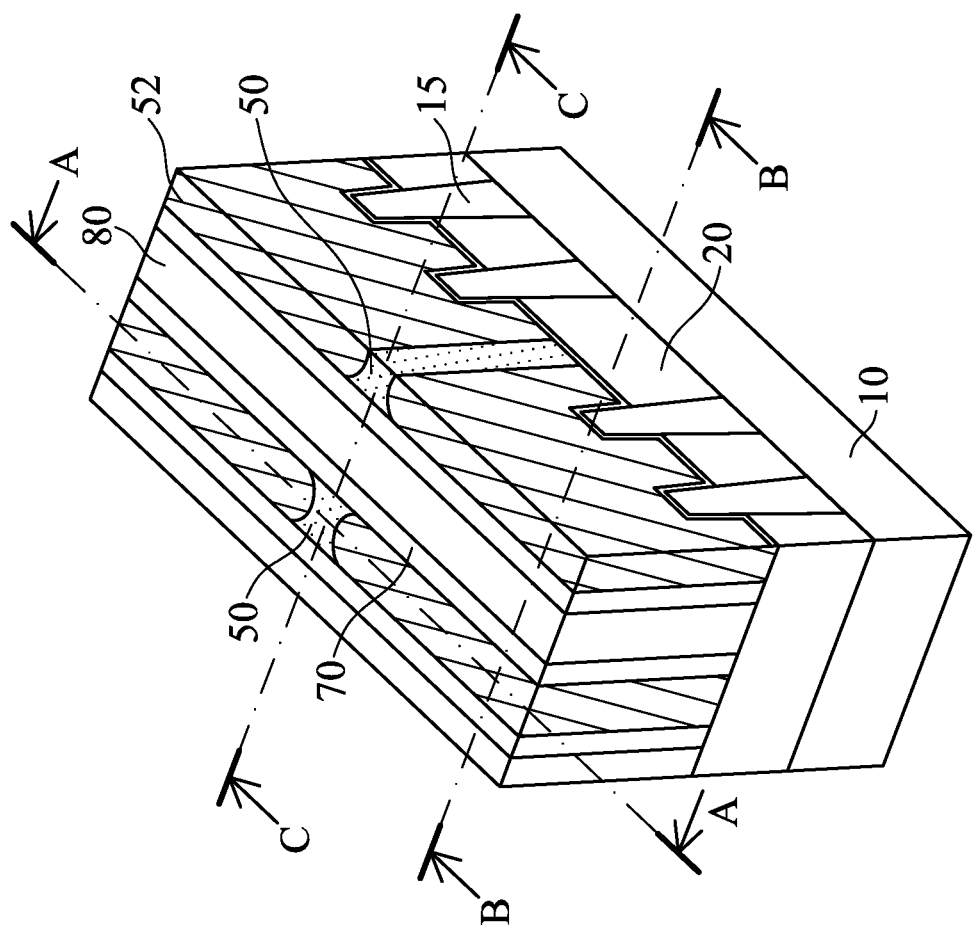
FIG. 1 is an isometric view of a semiconductor device according to an embodiment of the present disclosure.

FIG. 1 is an isometric view of a semiconductor device according to an embodiment of the present disclosure. The semiconductor device includes a plurality of fin structures 15 protruding from an isolation insulating layer 20. The fin structures 15 and isolation insulating layer 20 are formed on a semiconductor substrate 10. In some embodiments, the fin structures 15 are formed by etching the substrate, in these embodiments the fin structures 15 can be considered as part of the substrate. In other embodiments, the fin structures 15 are formed by material deposition operations, such as epitaxial deposition, on a substrate. Gate electrode structures 52 are formed over the fin structures 15. Insulating sidewall spacers 70 are formed on opposing side surfaces of the gate electrode structures 52. Adjacent gate electrode structures 52 extending along the X-direction are separated by an insulating layer 50. In some embodiments, a plurality of gate electrode structures 52 extending along the X-direction are arranged along the Y-direction. An interlayer dielectric layer 80 is formed between the insulating sidewall spacers 70 of adjacent gate electrode structures arranged along the Y-direction.

FIGS. 2A-11C show exemplary sequential processes for manufacturing semiconductor devices according to embodiments of the present disclosure. It is understood that additional operations can be provided before, during, and after processes shown by FIGS. 2A-11C, and some of the operations described below can be replaced or eliminated, for certain embodiments of the method. The order of the operations/processes may be interchangeable. In FIGS. 2A-11C, the A figures are cross sections along line A-A (X-direction) of FIG. 1, the B figures are cross sections along line B-B (Y-direction) of FIG. 1, and the C figures are cross sections along line C-C along line C-C(Y-direction).

Figure 2A:
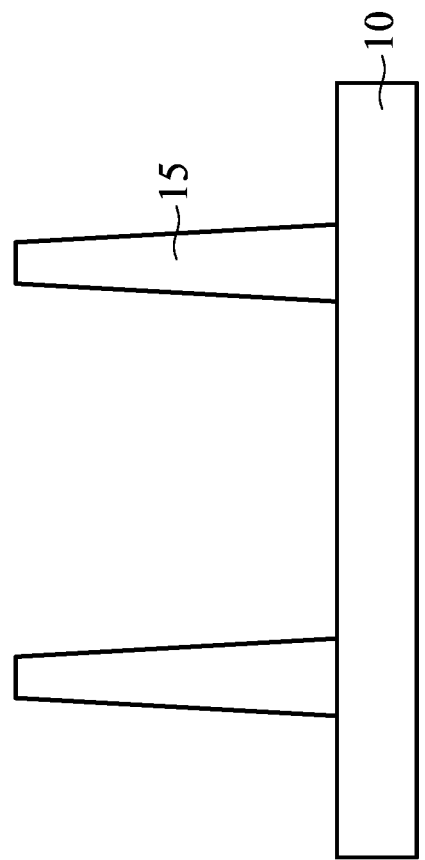
FIG. 2A shows a cross-sectional view taken along line A-A of FIG. 1 of one stage of a sequential process for manufacturing a semiconductor device according to an embodiment of the present disclosure.
Figure 2B:
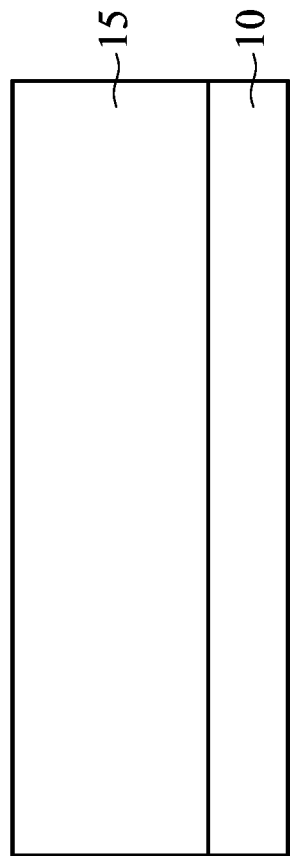
FIG. 2B shows a cross-sectional view taken along line B-B of FIG. 1 of one stage of a sequential process for manufacturing a semiconductor device according to an embodiment of the present disclosure.
Figure 2C:
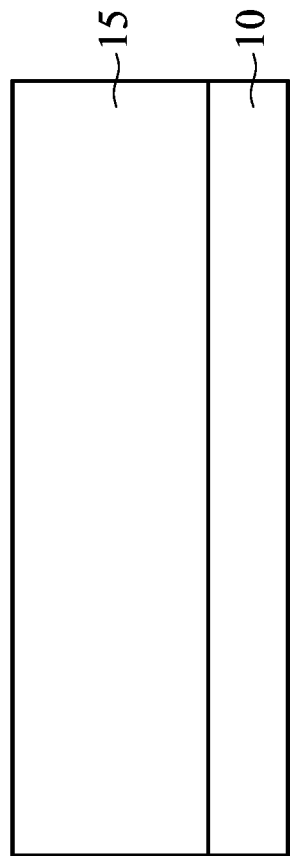
FIG. 2C shows a cross-sectional view taken along line C-C of FIG. 1 of one stage of a sequential process for manufacturing a semiconductor device according to an embodiment of the present disclosure.

FIG. 2A is a cross sectional view along the X-direction showing a plurality of fin structures 15 formed on a semiconductor substrate 10. FIG. 2B is a cross sectional view along the Y-direction showing the fin structure 15 formed on the semiconductor substrate 10. FIG. 2C is a cross sectional view along the Y-direction showing the fin structure 15 formed on the semiconductor substrate 10.

In one embodiment, the substrate 10 includes a single crystalline semiconductor layer on at least its surface portion. The substrate 10 may comprise a single crystalline semiconductor material such as, but not limited to Si, Ge, SiGe, GaAs, InSb, GaP, GaSb, InAlAs, InGaAs, GaSbP, GaAsSb, InP, or any combination thereof. The substrate 10 may be a silicon-on-insulator (SOI) substrate. In certain embodiments, the substrate 10 is made of Si. In some embodiments, the substrate 10 is, for example, a p-type silicon substrate with an impurity concentration in a range of about $1\times10^{15}$ atoms $cm^{-3}$ to about $2\times10^{15}$ atoms $cm^{-3}$. In other embodiments, the substrate 10 is an n-type silicon substrate with an impurity concentration in a range of about $1\times10^{15}$ atoms $cm^{-3}$ to about $2\times10^{15}$ atoms $cm^{-3}$.

In some embodiments, the substrate 10 is patterned to form a plurality of fin structures, as shown in FIG. 2A. As shown in FIG. 1, the fin structures 15 extend in a first direction (e.g., Y direction) and the plurality of fin structures 15 are arranged along a second direction (e.g., X direction) substantially perpendicular to the first direction. Four fin structures 15 are shown in FIG. 1 and two fin structures 15 are shown in FIG. 2A for illustrative purposes. The number of fin structures can vary in devices according to the present disclosure, and the devices may include three or more than four fin structures.

The width of the fin structure 15 is in a range from about 5 nm to about 40 nm in some embodiments, and is in a range from about 7 nm to about 12 nm in other embodiments. The height of the fin structure 15 is in a range from about 100 nm to about 300 nm in some embodiments, and is in a range from about 50 nm to 100 nm in other embodiments. When the heights of the fin structures are not uniform, the height from the substrate may be measured from the plane that corresponds to the average heights of the fin structures. The space between the fin structures 15 is in a range of about 5 nm to about 80 nm in some embodiments, and may be in a range of about 7 nm to 15 nm in other embodiments. One skilled in the art will realize, however, that the dimensions and values recited throughout the descriptions are merely examples, and may be changed to suit different scales of integrated circuits.

The fin structures 15 may be patterned by any suitable method. For example, the fin structures 15 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

Figure 3A:
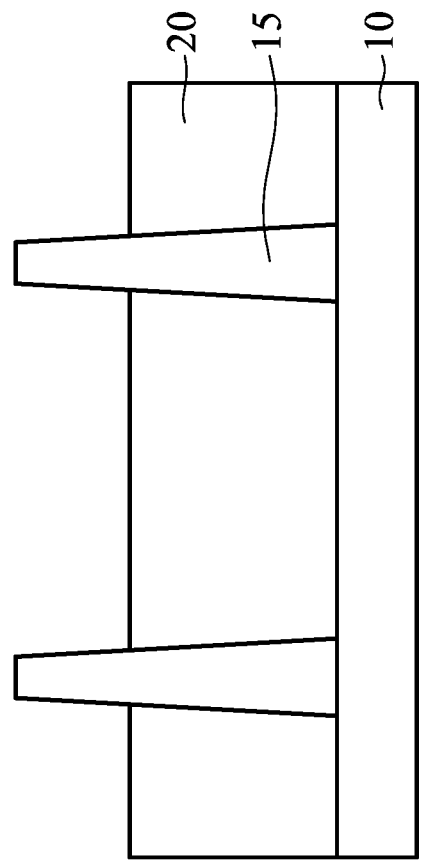
FIG. 3A shows a cross-sectional view taken along line A-A of FIG. 1 of one stage of a sequential process performed on the device of FIGS. 2A-2C.
Figure 3B:
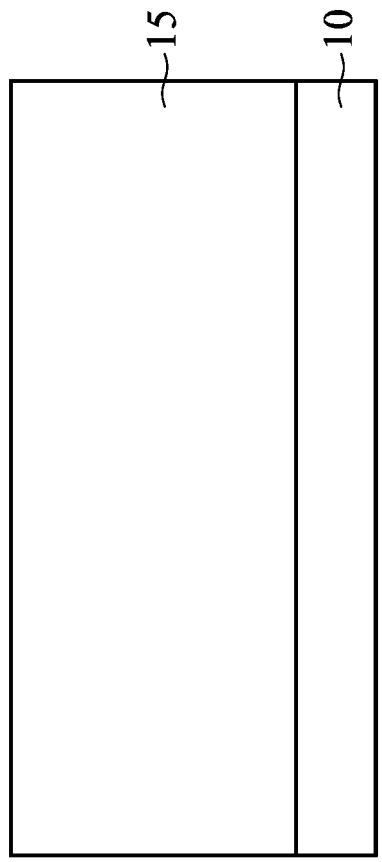
FIG. 3B shows a cross-sectional view taken along line B-B of FIG. 1 of one stage of a sequential process performed on the device of FIGS. 2A-2C.
Figure 3C:
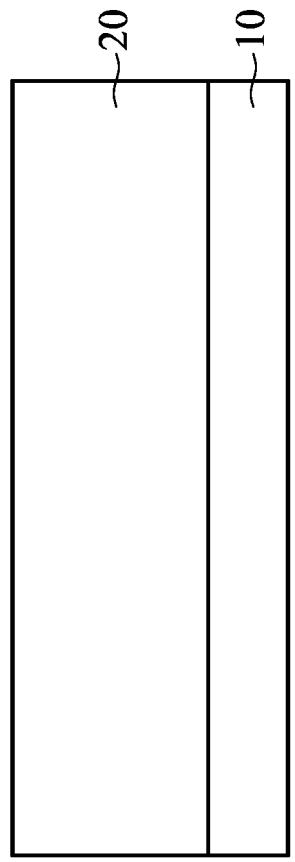
FIG. 3C shows a cross-sectional view taken along line C-C of FIG. 1 of one stage of a sequential process performed on the device of FIGS. 2A-2C.

FIGS. 3A-3C show an isolation insulating layer 20 formed on the substrate 10 and surrounding the fin structures 15. FIG. 3A shows a cross-sectional view taken along line A-A of FIG. 1, FIG. 3B shows a cross-sectional view taken along line B-B of FIG. 1, and FIG. 3C shows a cross-sectional view taken along line C-C of FIG. 1. The portion of the fin structures 15 protruding through the isolation insulating layer 20 will become the channel regions of the subsequently formed devices, and the portion embedded in the isolation insulating layer 20 may become the well regions. The height of the well region is in a range from about 60 nm to 200 nm in some embodiments, and the height of the channel region is in a range from about 40 nm to 150 nm, and is in a range from about 60 nm to about 100 nm in other embodiments.

The isolation insulating layer 20 includes one or more layers of an insulating material. The insulating material for the isolation insulating layer 20 may include silicon oxide, including silicon dioxide; silicon nitride, including $Si_3N_4$; silicon oxynitride (SiON); SiOCN; fluorine-doped silicate glass (FSG); or a low-k dielectric material, formed by low pressure chemical vapor deposition (LPCVD), plasma enhanced chemical vapor deposition (PECVD) or flowable chemical vapor deposition. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove un-desired element(s) to form silicon oxide. When the un-desired element(s) is removed, the flowable film densifies and shrinks. In some embodiments, multiple anneal processes are conducted. In some embodiments, the isolation insulating layer 20 may be formed by using spin on glass (SOG). In some embodiments, the isolation insulating material extends over the uppermost surface of the substrate, and a planarization operation, such as a chemical mechanical polishing (CMP) method and/or an etch-back method, is subsequently performed to remove the upper portion of the isolation insulating layer.

In certain embodiments, the upper portion of the isolation insulating layer 20 may be removed by using a wet etching process, for example, by dipping the substrate in hydrofluoric acid (HF). In another embodiment, removing the upper portion of the isolation insulating layer 20 may be performed using a dry etching process. For example, a dry etching process using $CHF_3$ or $BF_3$ as etching gases may be used.

Figure 4A:
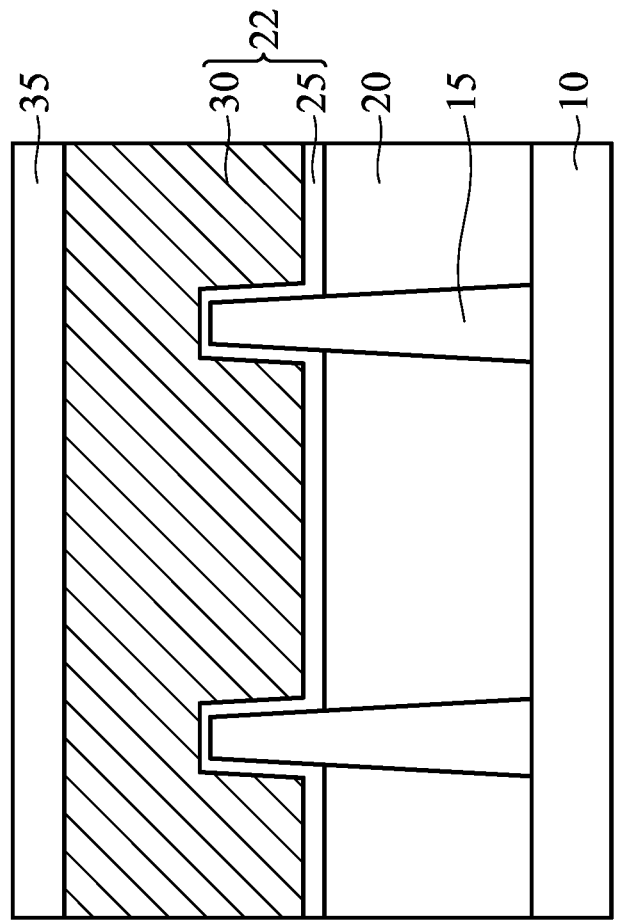
FIG. 4A shows a cross-sectional view taken along line A-A of FIG. 1 of one stage of a sequential process performed on the device of FIGS. 3A-3C.
Figure 4B:
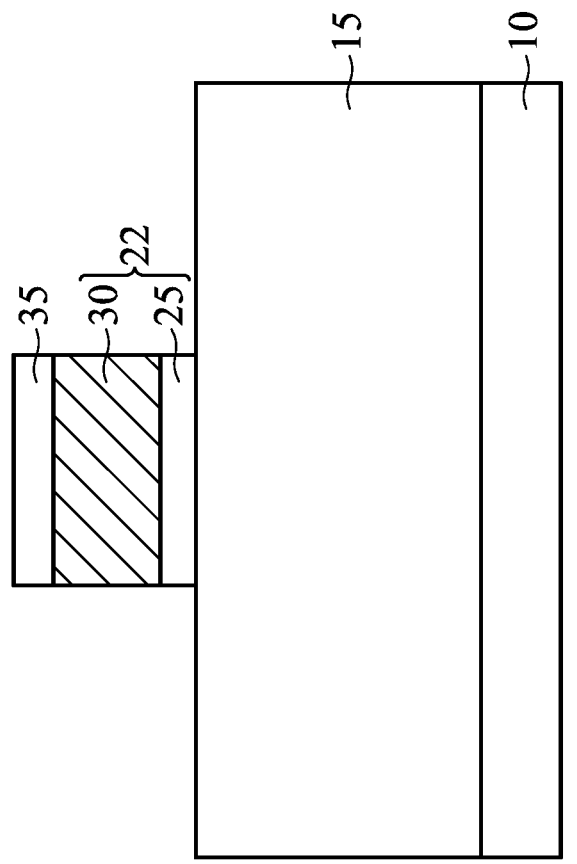
FIG. 4B shows a cross-sectional view taken along line B-B of FIG. 1 of one stage of a sequential process performed on the device of FIGS. 3A-3C.
Figure 4C:
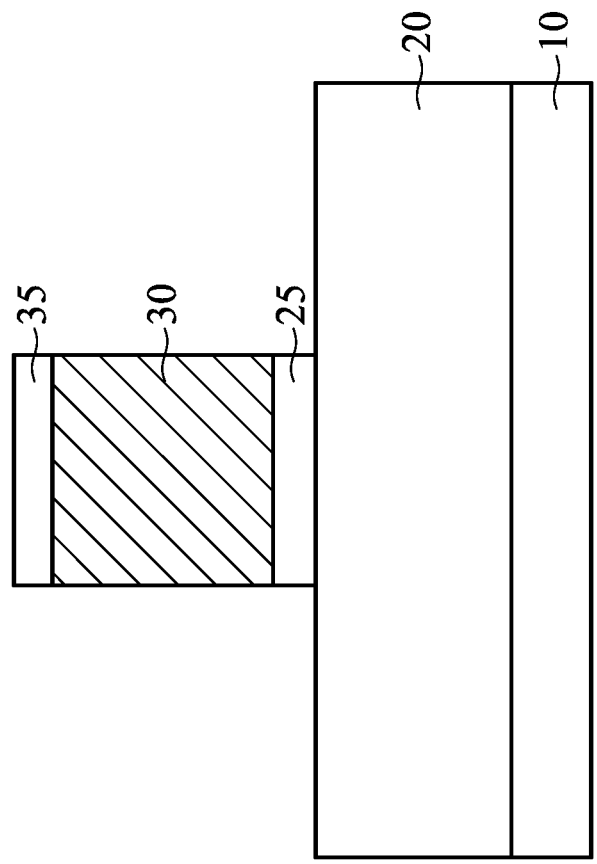
FIG. 4C shows a cross-sectional view taken along line C-C of FIG. 1 of one stage of a sequential process performed on the device of FIGS. 3A-3C.

Subsequently, a gate electrode structure 22 including a gate dielectric layer 25 and a gate electrode layer 30 are formed over the protruding portions of the fin structures 15 and the isolation insulating layer 20, as shown in FIGS. 4A-4C. FIG. 4A shows a cross-sectional view taken along line A-A of FIG. 1, FIG. 4B shows a cross-sectional view taken along line B-B of FIG. 1, and FIG. 4C shows a cross-sectional view taken along line C-C of FIG. 1. In some embodiments, the gate electrode layer 30 is formed of polysilicon. In some embodiments, the gate electrode structure 22 is a dummy gate electrode structure, the gate dielectric layer 25 is a dummy gate dielectric layer, and the gate electrode layer 30 is a dummy gate electrode layer. In some embodiments, a hard mask layer 35 is formed over the gate electrode structure 22. In some embodiments, the hard mask 35 includes one or more layers of silicon oxide or silicon nitride. The hard mask layer 35 is formed by chemical vapor deposition, atomic layer deposition (ALD), or any suitable method. FIG. 4B shows the hard mask layer 35 and gate electrode structure 22 formed over the fin structure 15 along the length of the fin structure 15 (the Y-direction). In some embodiments, the width of the gate electrode layer 30 (Y-direction) is in the range of about 30 nm to about 60 nm.

In certain embodiments, the gate dielectric layer 25 includes one or more layers of a dielectric material, such as silicon oxide, silicon nitride, or high-k dielectric material, other suitable dielectric material, and/or combinations thereof.

Figure 5A:
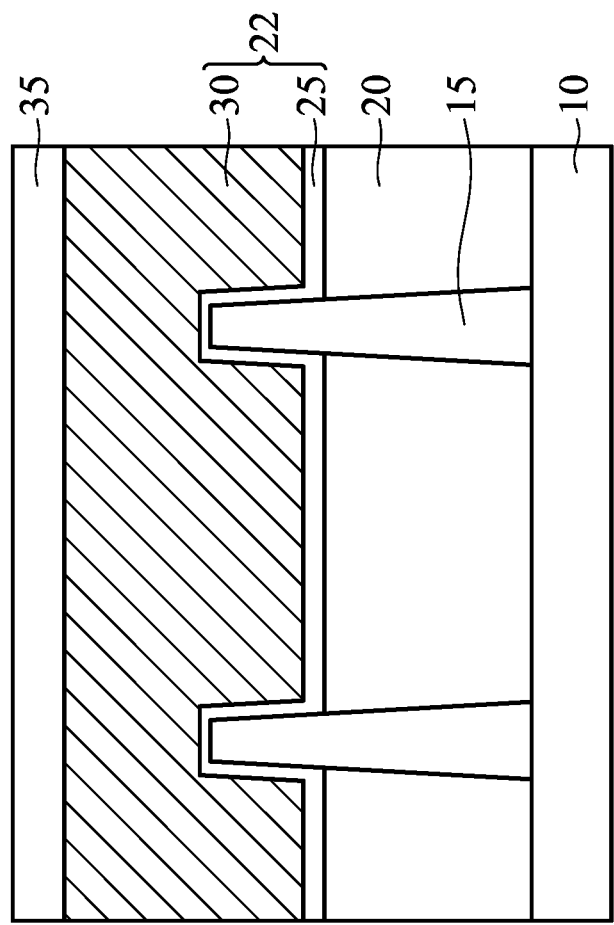
FIG. 5A shows a cross-sectional view taken along line B-B of FIG. 1 of one stage of a sequential process performed on the device of FIGS. 4A-4C.
Figure 5B:
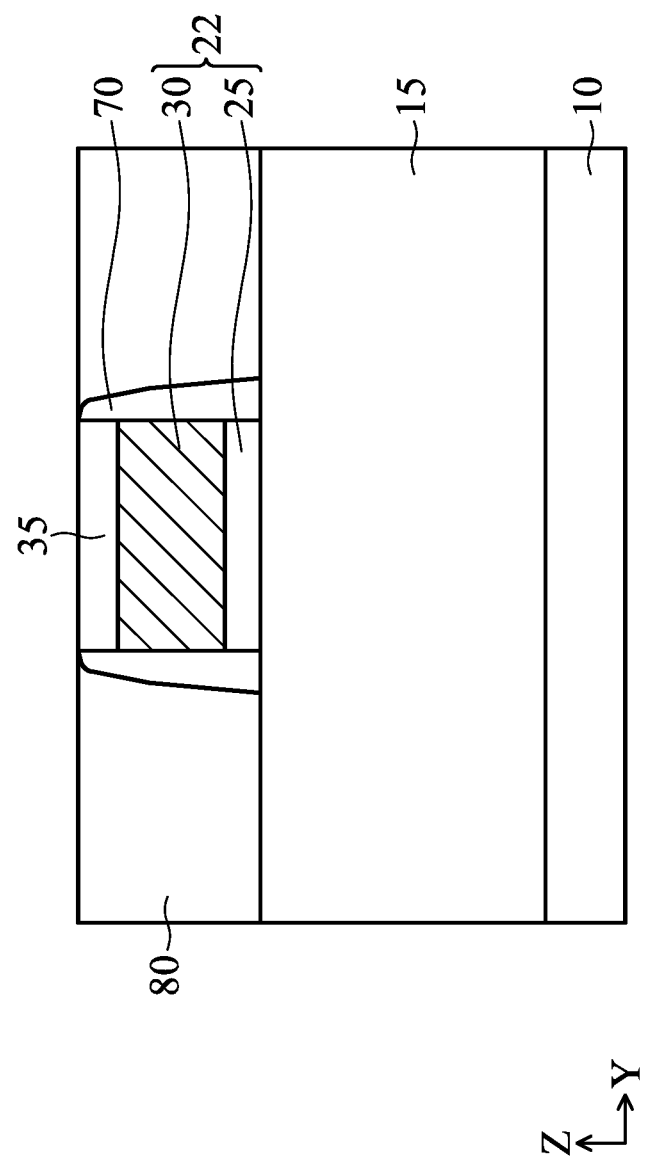
FIG. 5B shows a cross-sectional view taken along line B-B of FIG. 1 of one stage of a sequential process performed on the device of FIGS. 4A-4C.
Figure 5C:
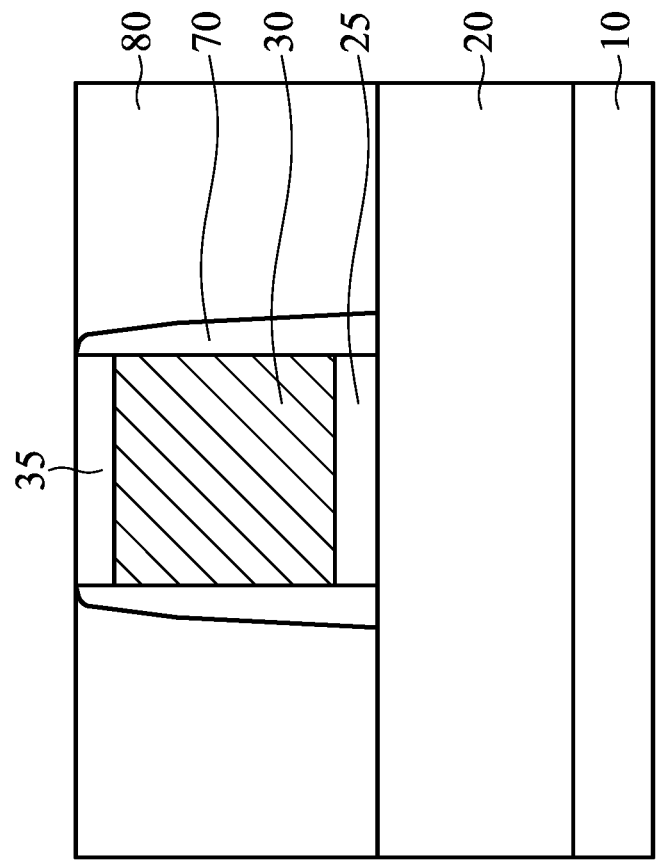
FIG. 5C shows a cross-sectional view taken along line C-C of FIG. 1 of one stage of a sequential process performed on the device of FIGS. 4A-4C.

As shown in FIGS. 5A-5C, insulating sidewall spacers 70 are formed on opposing side surfaces of the gate electrode structure 22 in embodiments of the disclosure. FIG. 5A shows a cross-sectional view taken along line A-A of FIG. 1, FIG. 5B shows a cross-sectional view taken along line B-B of FIG. 1, and FIG. 5C shows a cross-sectional view taken along line C-C of FIG. 1. The insulating sidewall spacers 70 are one or more about 5 Å to about 500 Å thick layers of silicon nitride, silicon oxynitride, silicon carbide, SiON, SiCON, SiOC, or a combination thereof. The sidewall spacers 70 are formed by chemical vapor deposition, atomic layer deposition, or any suitable method. In some embodiments, the sidewall spacers 70 are formed by conformally depositing the sidewall spacer material on the gate structures 22 and then anisotropically etching to remove the sidewall spacer material from the top of the gate structures 22 and from between a region between adjacent gate structures, leaving the remaining sidewall spacer material on the sidewalls of the gate structure 22.

Source/drain regions (not shown) are formed on the fin structures 15 on opposing sides of the gate structure 22 outside the sidewall spacers 70. In some embodiments, the source/drain regions are formed by implanting a dopant into the fin structures 15 with the gate structure 22 and sidewall spacers 70 functioning as an implantation mask. In other embodiments, the source/drain regions are epitaxially deposited over portions of the fin structures 15 outside the sidewall spacers 70. After forming the source/drain regions, an interlayer dielectric (ILD) layer 80 is formed over the device. The interlayer dielectric layer 80 is an insulating layer made of an insulating material, such as one or more layers of silicon oxide, silicon nitride, a low-k dielectric material or a combination thereof. The interlayer dielectric layer 80 can be formed by chemical vapor deposition. The interlayer dielectric layer 80 is planarized, such as by chemical mechanical polishing. In some embodiments, the hard mask layer 35 is removed by the planarizing operation.

Figure 6A:
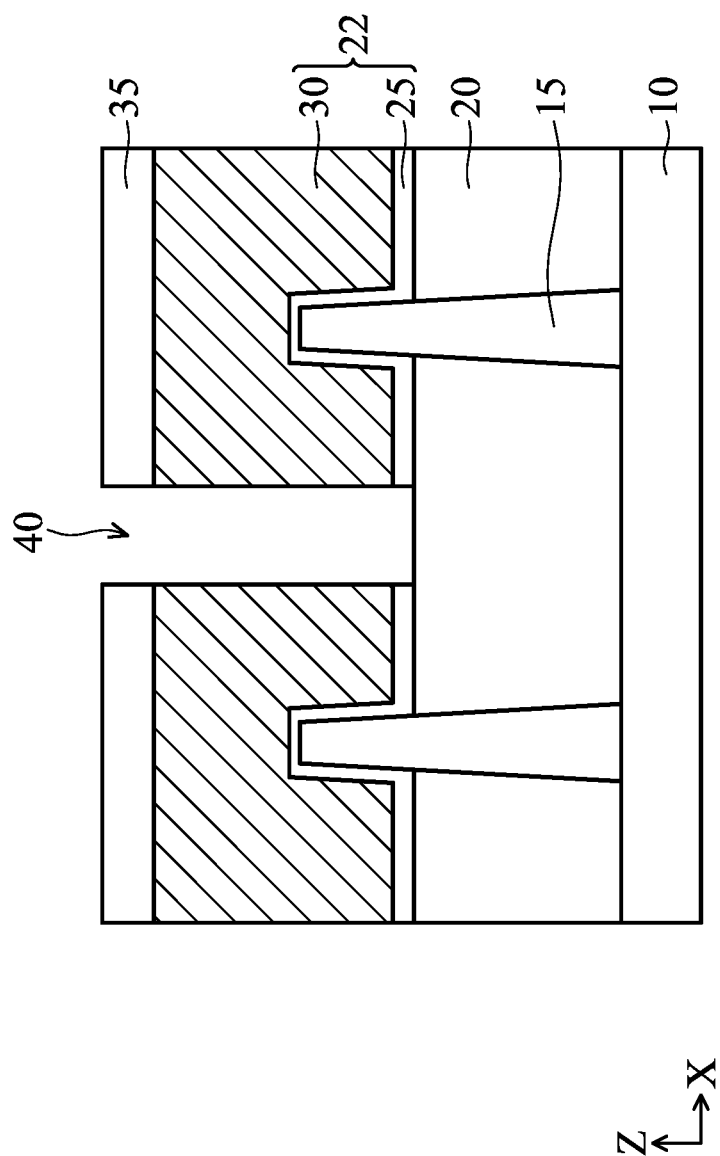
FIG. 6A shows a cross-sectional view taken along line A-A of FIG. 1 of one stage of a sequential process performed on the device of FIGS. 5A-5C.
Figure 6B:
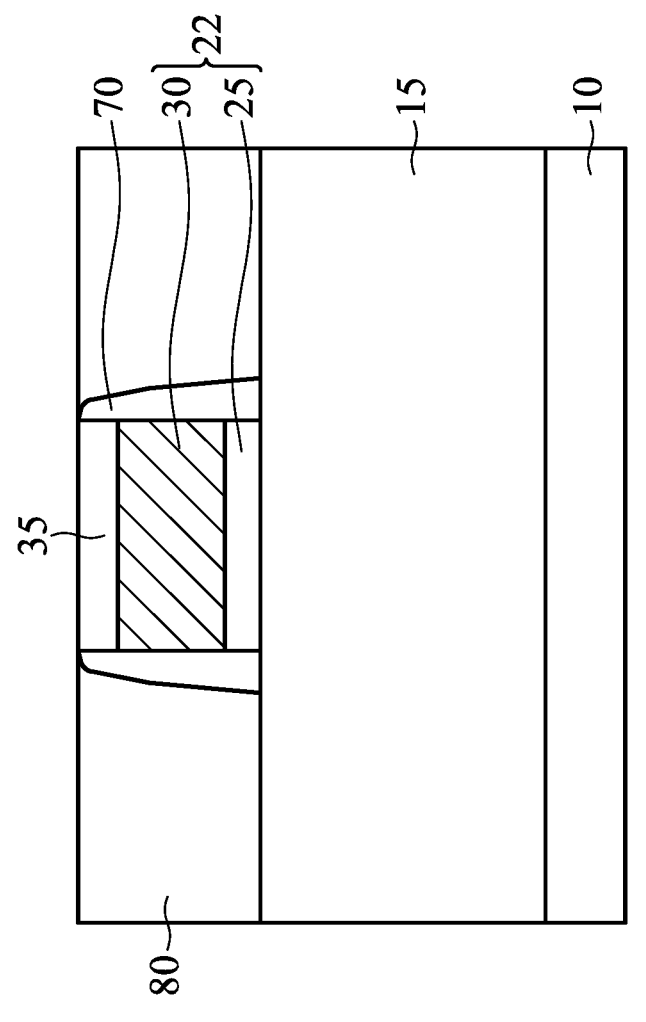
FIG. 6B shows a cross-sectional view taken along line B-B of FIG. 1 of one stage of a sequential process performed on the device of FIGS. 5A-5C.
Figure 6C:
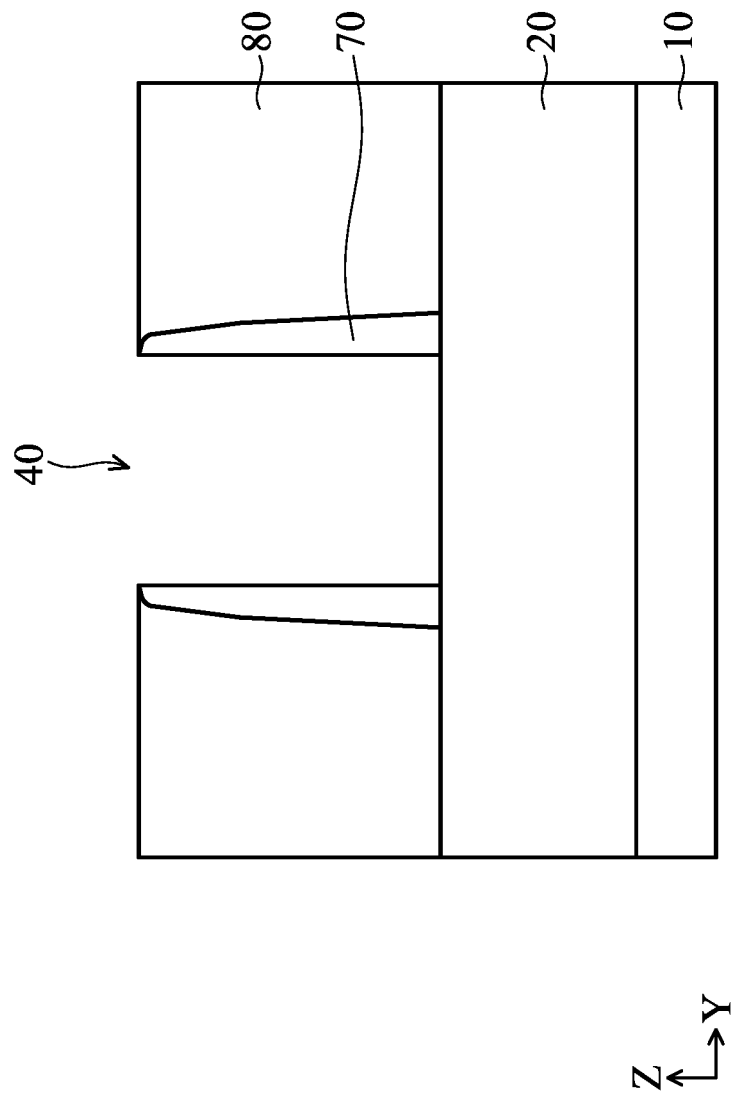
FIG. 6C shows a cross-sectional view taken along line C-C of FIG. 1 of one stage of a sequential process performed on the device of FIGS. 5A-5C.

Adverting to FIGS. 6A-6C, the hard mask layer 35 is subsequently patterned, and the pattern is extended into the gate electrode layer 30 and gate dielectric layer 25 to form an opening 40. FIG. 6A shows a cross-sectional view taken along line A-A of FIG. 1, FIG. 6B shows a cross-sectional view taken along line B-B of FIG. 1, and FIG. 6C shows a cross-sectional view taken along line C-C of FIG. 1. In certain embodiments, photolithographic and etching techniques are used to form the opening 40, thereby forming two spaced-apart gate electrode layers 30. For example, the hard mask layer 35 can be patterned by depositing a photoresist on the hard mask layer 35, and selectively exposing the photoresist to actinic radiation. The selective exposure can be achieved by exposing the photoresist with ultraviolet radiation through a mask, or using a laser or electron beam. The exposed photoresist is subsequently developed to form a pattern in the photoresist exposing a portion of the hard mask layer 35. The exposed portion of the hard mask layer 35 is subsequently etched using an appropriate etchant, and the pattern is extended through the gate electrode layer 30 and gate dielectric layer 25 using appropriate etchants to form opening 40.

Figure 7A:
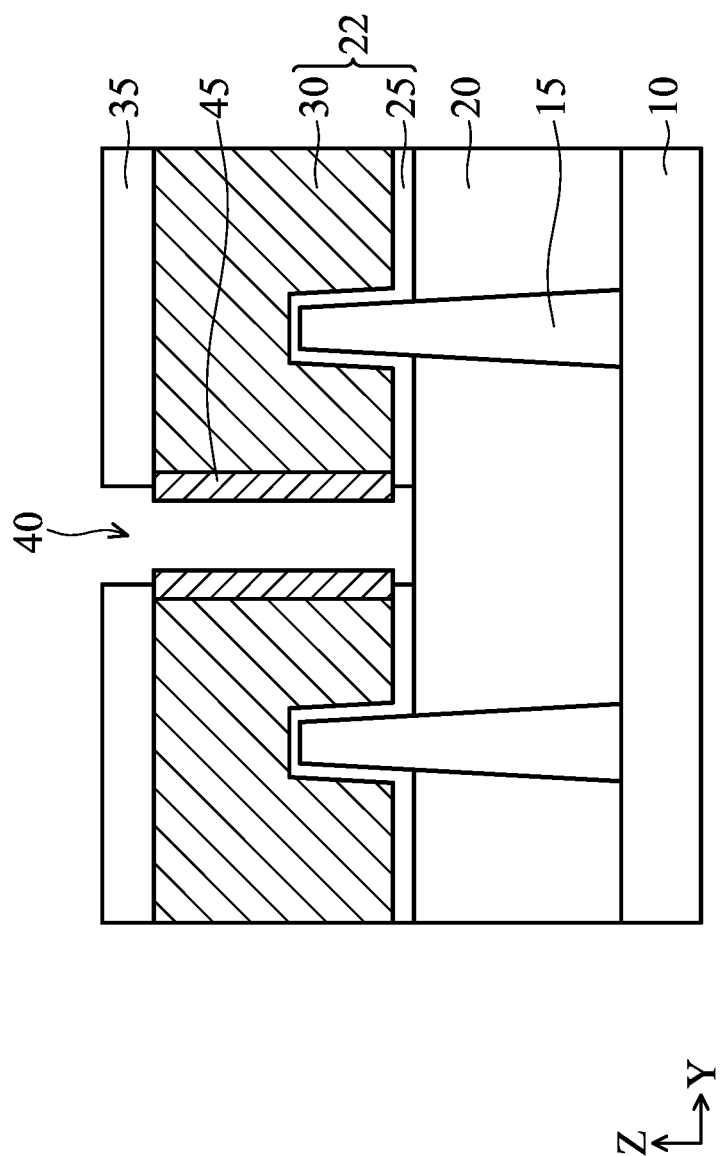
FIG. 7A shows a cross-sectional view taken along line A-A of FIG. 1 of one stage of a sequential process performed on the device of FIGS. 6A-6C.
Figure 7B:
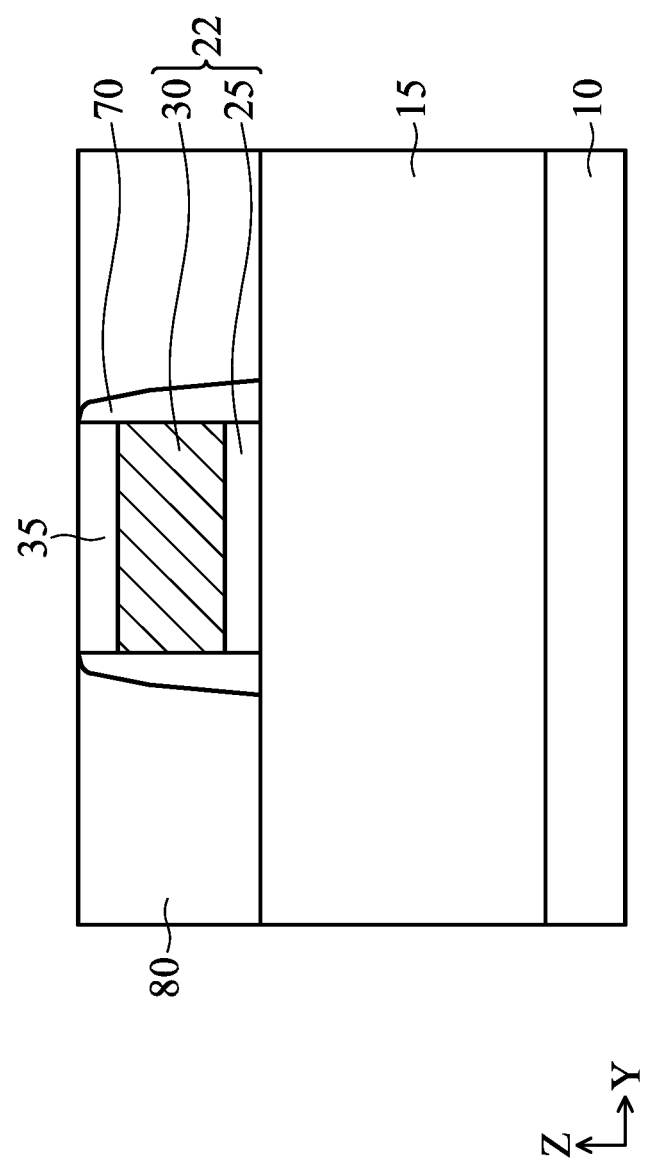
FIG. 7B shows a cross-sectional view taken along line B-B of FIG. 1 of one stage of a sequential process performed on the device of FIGS. 6A-6C.
Figure 7C:
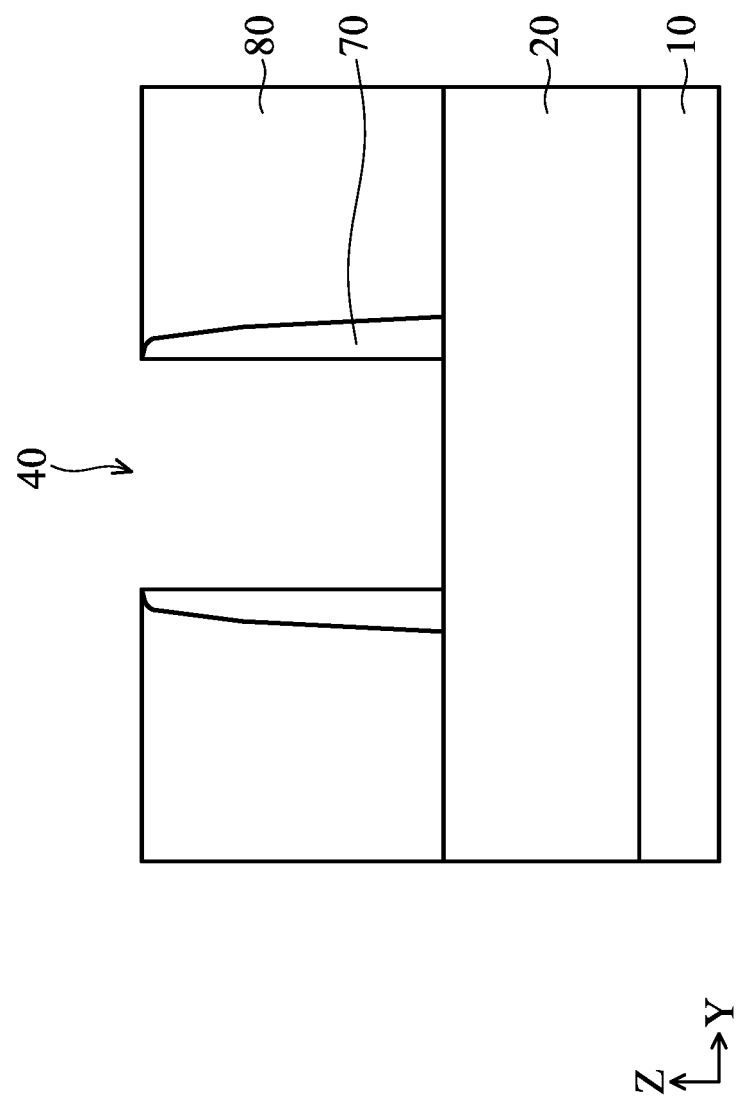
FIG. 7C shows a cross-sectional view taken along line C-C of FIG. 1 of one stage of a sequential process performed on the device of FIGS. 6A-6C.

As shown in FIGS. 7A-7C, an oxidation or nitridation treatment is performed in a region between the two spaced apart gate electrode layers 30. FIG. 7A shows a cross-sectional view taken along line A-A of FIG. 1, FIG. 7B shows a cross-sectional view taken along line B-B of FIG. 1, and FIG. 7C shows a cross-sectional view taken along line C-C of FIG. 1. The oxidation or nitridation treatment forms a first insulating layer 45 in the opening between the two spaced apart gate electrode layers 30. In some embodiments, the oxidation and/or nitridation treatment includes applying an oxygen plasma and/or nitrogen plasma to the region between the two spaced apart gate electrode layers and forming the first insulating layer on sidewalls of the region between the two spaced apart gate electrode layers. The oxygen and nitrogen plasmas react with the gate electrode layer material, such as polysilicon, thereby forming an oxide or nitride layer. In some embodiments, the oxygen plasma or nitrogen plasma is applied at a power of 0.5 kW to about 6 kW, an oxygen or nitrogen flow rate of about 100 to about 1000 sccm, and at a pressure of about 40 mTorr to about 400 mTorr. In some embodiments, the oxygen plasma or nitrogen plasma is applied at a power of 1 kW to about 3 kW, an oxygen or nitrogen flow rate of about 200 to about 1000 sccm, and at a pressure of about 60 mTorr to about 300 mTorr. In other embodiments, the oxygen plasma or nitrogen plasma is applied at a power of 1.5 kW to about 2.5 kW, an oxygen or nitrogen flow rate of about 400 to about 800 sccm, and at a pressure of about 100 mTorr to about 200 mTorr. In some embodiments, the first insulating layer 45 is an about 5 Å to about 200 Å thick layer of silicon dioxide, silicon oxynitride, silicon carbide, SiCON, or SiOC. The source of the carbon for the first insulating layer 45 including silicon carbide, SICON, or SiOC is the sidewall spacers 70 adjacent the opening 40, which are formed of silicon carbide, SiCON, or SiOC in some embodiments. In some embodiments, the oxygen or nitrogen plasma reacts with the gate electrode layer 30 and the sidewall spacers 70 adjacent the opening 40 to form the first insulating layer 45.

Figure 8A:
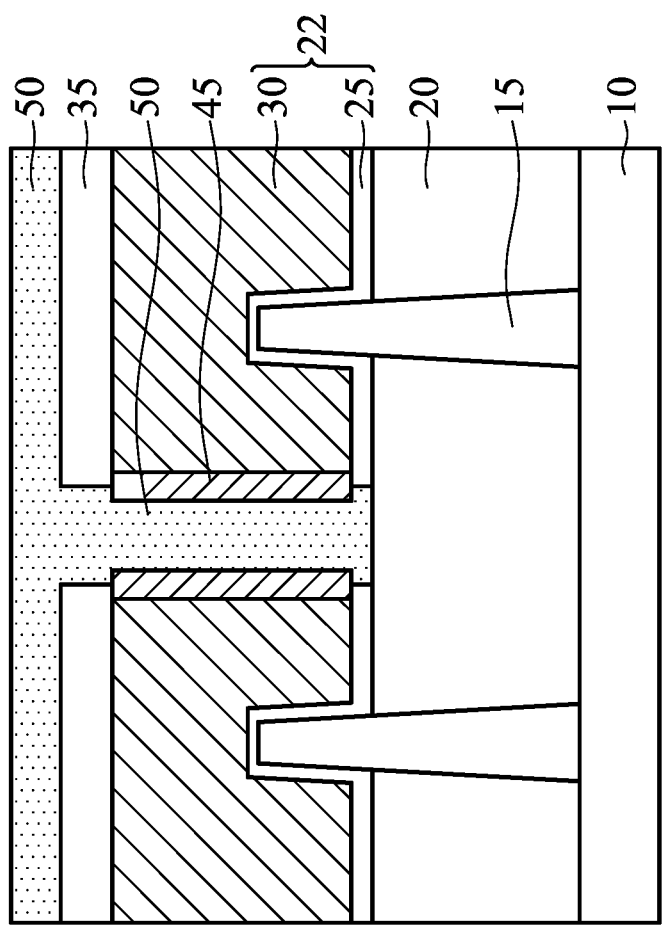
FIG. 8A shows a cross-sectional view taken along line A-A of FIG. 1 of one stage of a sequential process performed on the device of FIGS. 7A-7C.
Figure 8B:
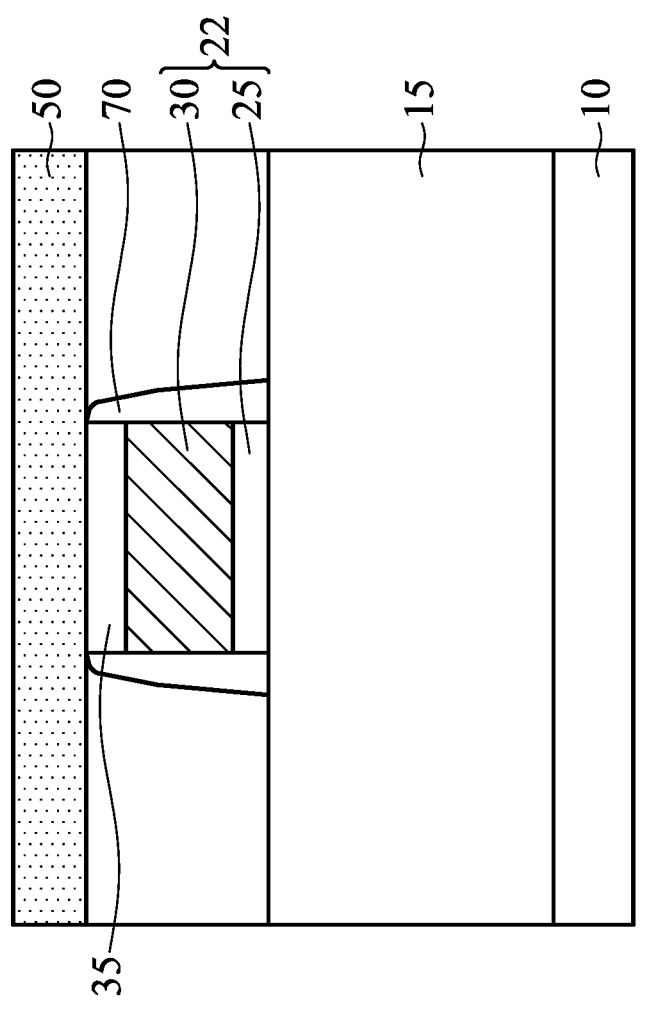
FIG. 8B shows a cross-sectional view taken along line B-B of FIG. 1 of one stage of a sequential process performed on the device of FIGS. 7A-7C.
Figure 8C:
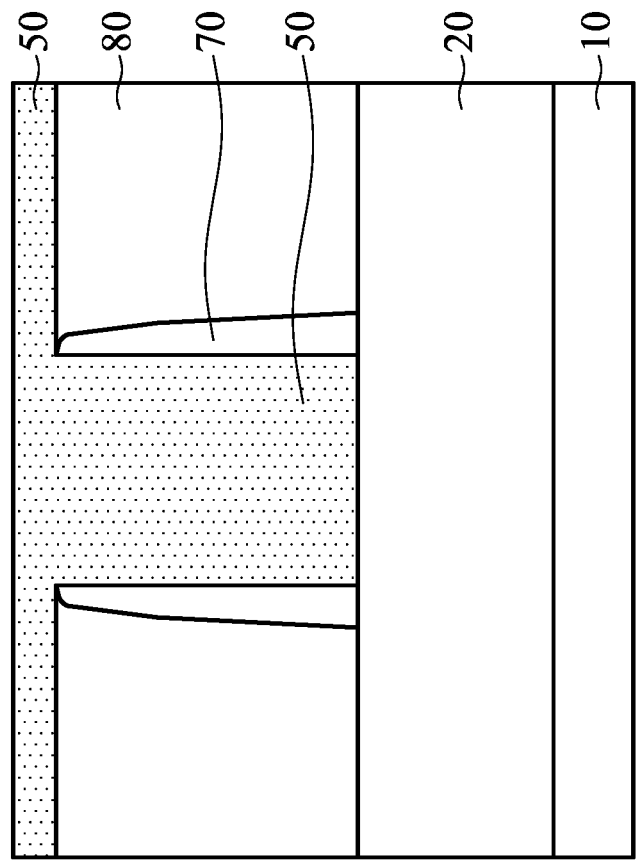
FIG. 8C shows a cross-sectional view taken along line C-C of FIG. 1 of one stage of a sequential process performed on the device of FIGS. 7A-7C.

An insulating material is deposited in the opening 40 to form a second insulating layer 50, as shown in FIGS. 8A-8C. FIG. 8A shows a cross-sectional view taken along line A-A of FIG. 1, FIG. 8B shows a cross-sectional view taken along line B-B of FIG. 1, and FIG. 8C shows a cross-sectional view taken along line C-C of FIG. 1. In some embodiments, the second insulating layer 50 extends out of opening 40 and covers the upper surface of the hard mask layer 35. In some embodiments, the second insulating layer 50 is about 5 Å to about 200 Å thick layer of silicon nitride, silicon oxynitride, silicon carbide, SiCON, or SiOC. The second insulating layer 50 is formed by chemical vapor deposition, atomic layer deposition, or any suitable method. The second insulating layer 50 is formed of a different material than the first insulating layer 45 and the sidewall spacers 70 in some embodiments.

Figure 9A:
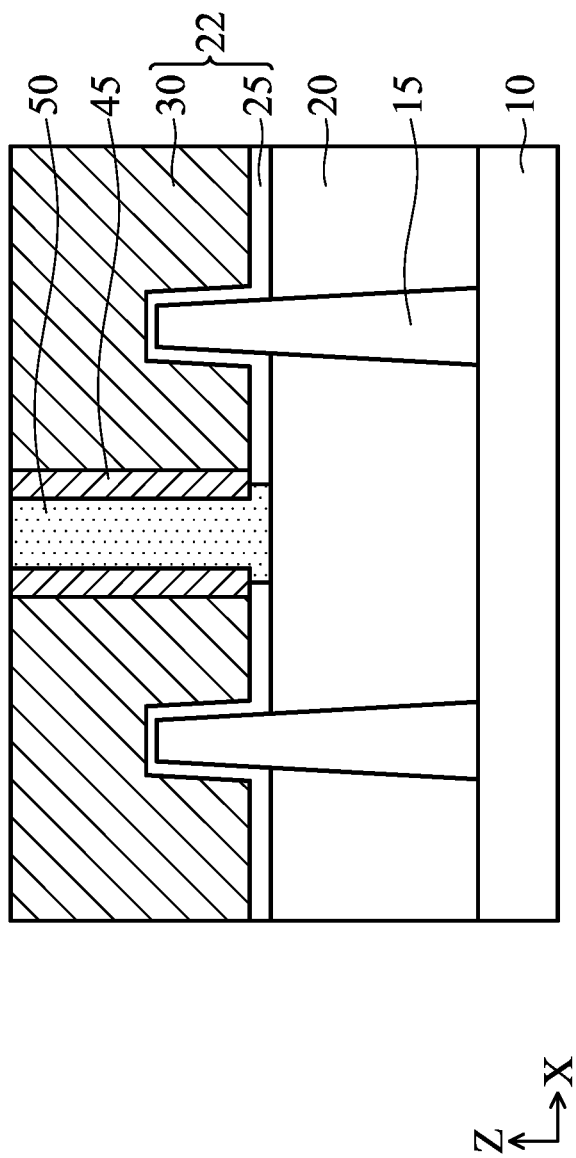
FIG. 9A shows a cross-sectional view taken along line A-A of FIG. 1 of one stage of a sequential process performed on the device of FIGS. 8A-8C.
Figure 9B:
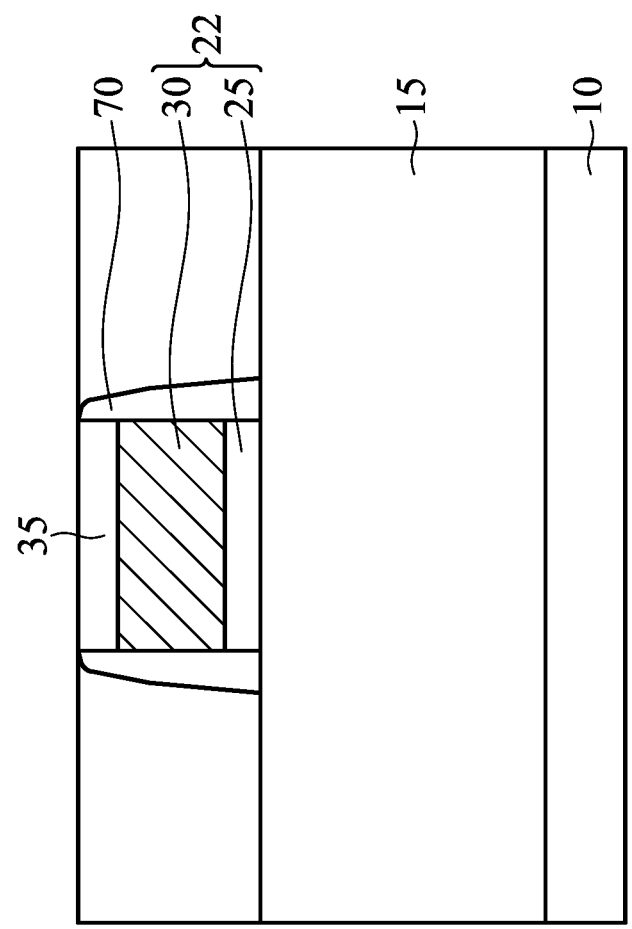
FIG. 9B shows a cross-sectional view taken along line B-B of FIG. 1 of one stage of a sequential process performed on the device of FIGS. 8A-8C.
Figure 9C:
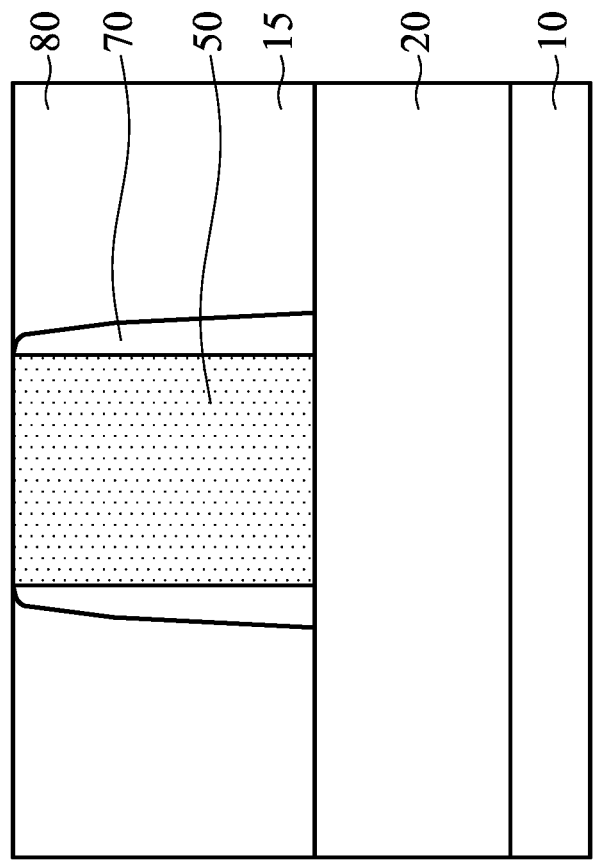
FIG. 9C shows a cross-sectional view taken along line C-C of FIG. 1 of one stage of a sequential process performed on the device of FIGS. 8A-8C.

The second insulating layer 50 is subsequently planarized, and the hard mask layer 35 is removed, as shown in FIGS. 9A-9C. FIG. 9A shows a cross-sectional view taken along line A-A of FIG. 1, FIG. 9B shows a cross-sectional view taken along line B-B of FIG. 1, and FIG. 9C shows a cross-sectional view taken along line C-C of FIG. 1. Chemical-mechanical polishing (CMP) or an etch back operation is performed in some embodiments to planarize the second insulating layer 50.

Figure 10A:
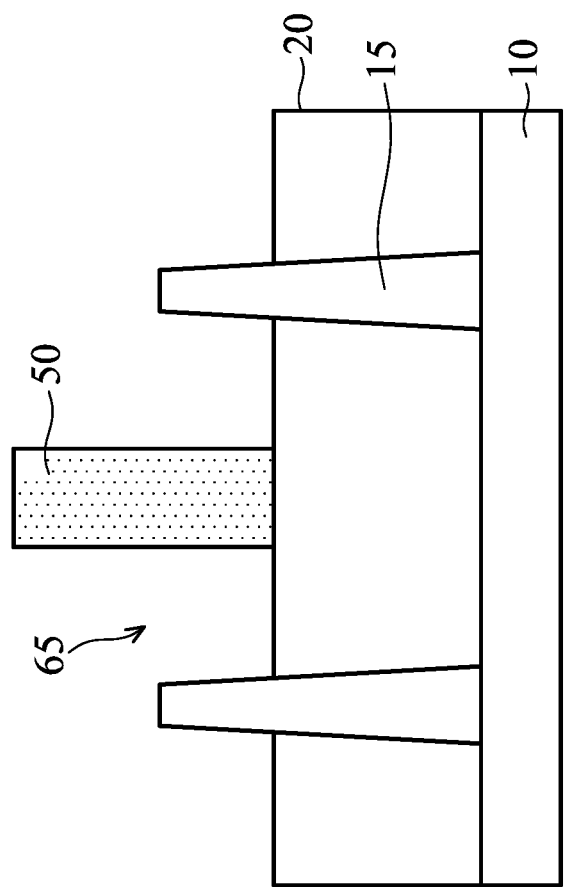
FIG. 10A shows a cross-sectional view taken along line A-A of FIG. 1 of one stage of a sequential process performed on the device of FIGS. 9A-9C.
Figure 10B:
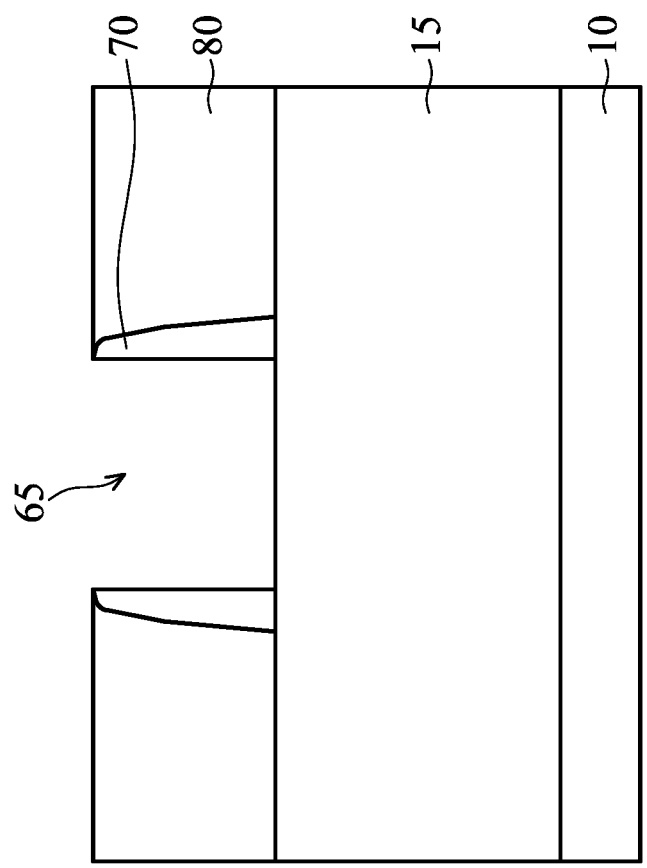
FIG. 10B shows a cross-sectional view taken along line B-B of FIG. 1 of one stage of a sequential process performed on the device of FIGS. 9A-9C.
Figure 10C:
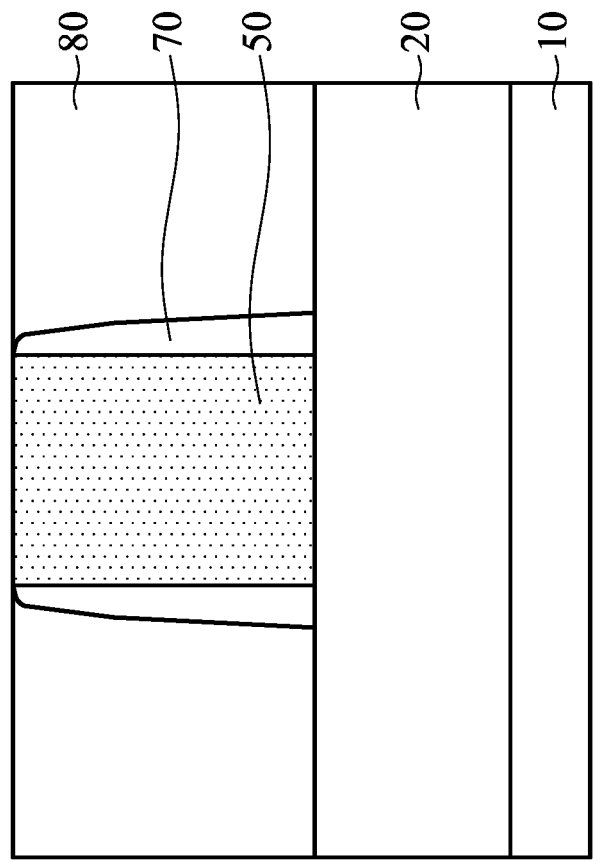
FIG. 10C shows a cross-sectional view taken along line C-C of FIG. 1 of one stage of a sequential process performed on the device of FIGS. 9A-9C.
Figure 10D:
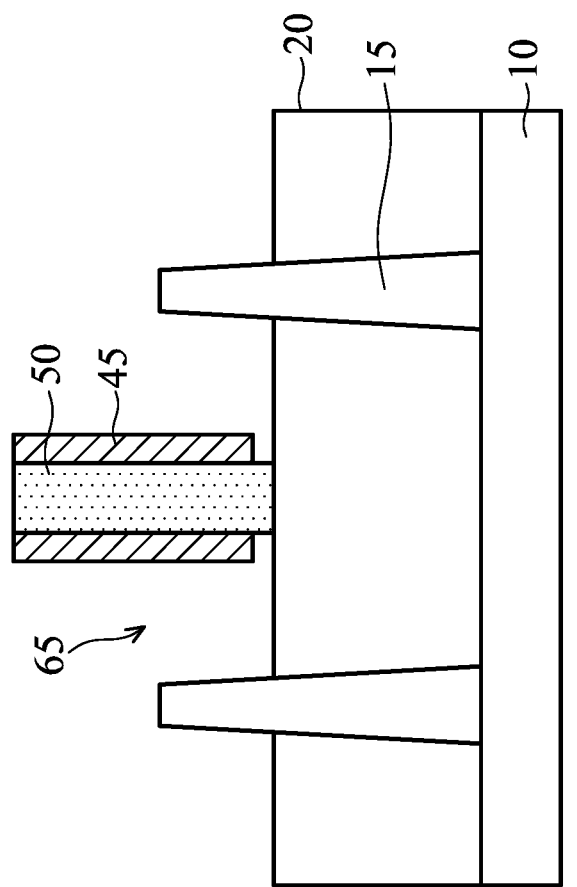
FIG. 10D shows a cross-sectional view taken along line A-A of FIG. 1 of one stage of a sequential process of another embodiment performed on the device of FIGS. 9A-9C.

In some embodiments, the gate electrode structure 22 is a dummy gate electrode structure, including a dummy gate electrode layer 30 and a dummy gate dielectric layer 25, and the dummy gate electrode structure 22 is subsequently removed, such as by an etching operation, as shown in FIGS. 10A-10C, forming a pair of gate openings 65 on opposing sides of the second insulating layer 50. FIG. 10A shows a cross-sectional view taken along line A-A of FIG. 1, FIG. 10B shows a cross-sectional view taken along line B-B of FIG. 1, and FIG. 10C shows a cross-sectional view taken along line A-A of FIG. 1. The first insulating layer 45 is subsequently removed from between the second insulating layer 50 and the gate openings 65 in some embodiments. In some embodiments, the portion of the first insulating layer 45 between the second insulating layer 50 and the dummy gate electrode layer 30 is removed during the dummy gate electrode layer removal operation. In some embodiments, a portion of the first insulating layer 45 remains between the second insulating layer 50 and the sidewall spacers 70, as shown in FIG. 10D, a cross-sectional view taken along line C-C of FIG. 1. (See also, FIGS. 12E-12H, 13A, 13B, 13D, and 13E). The second insulating layer 50 remains between the fin structures 15.

Figure 11A:
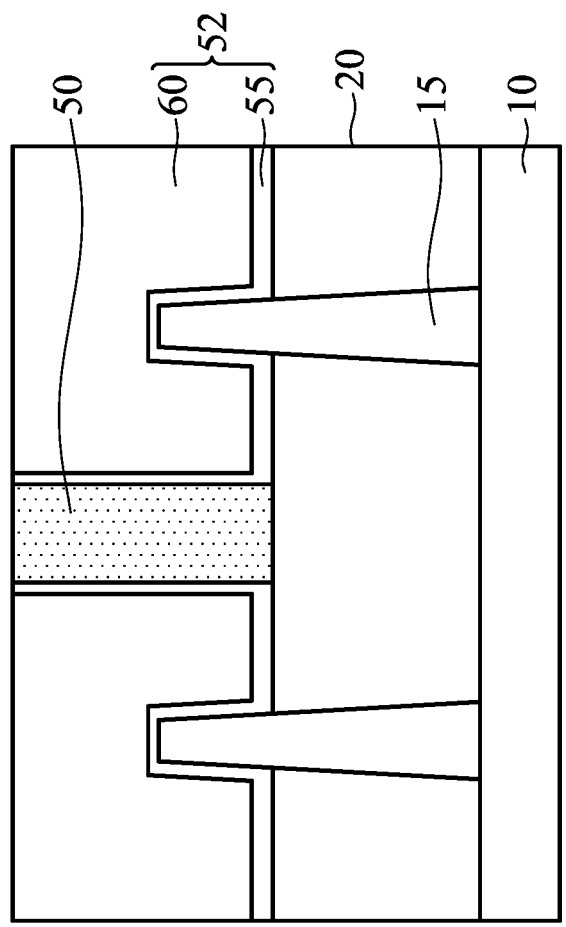
FIG. 11A shows a cross-sectional view taken along line A-A of FIG. 1 of one stage of a sequential process performed on the device of FIGS. 10A-10C.
Figure 11B:
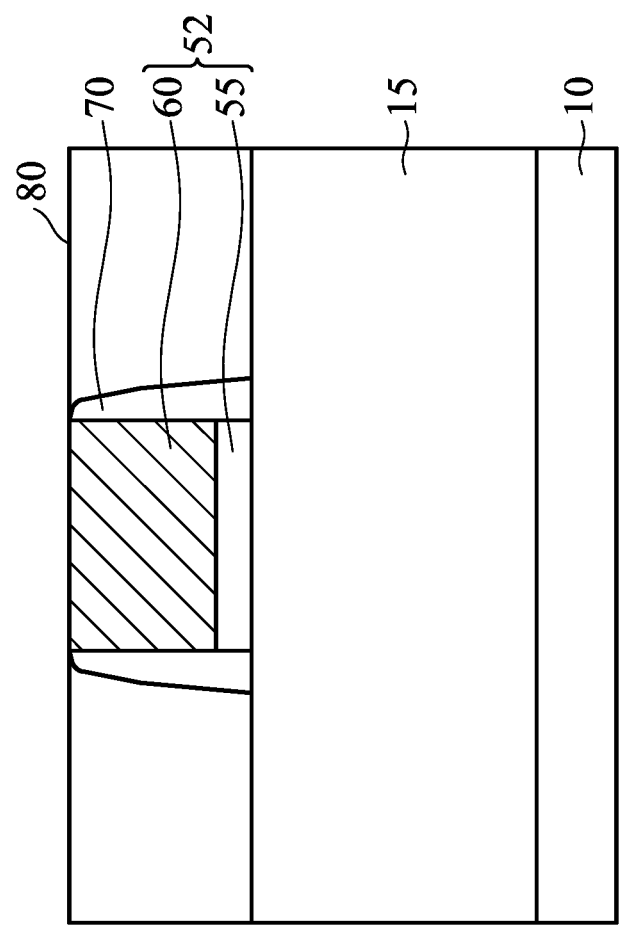
FIG. 11B shows a cross-sectional view taken along line B-B of FIG. 1 of one stage of a sequential process performed on the device of FIGS. 10A-10C.
Figure 11C:
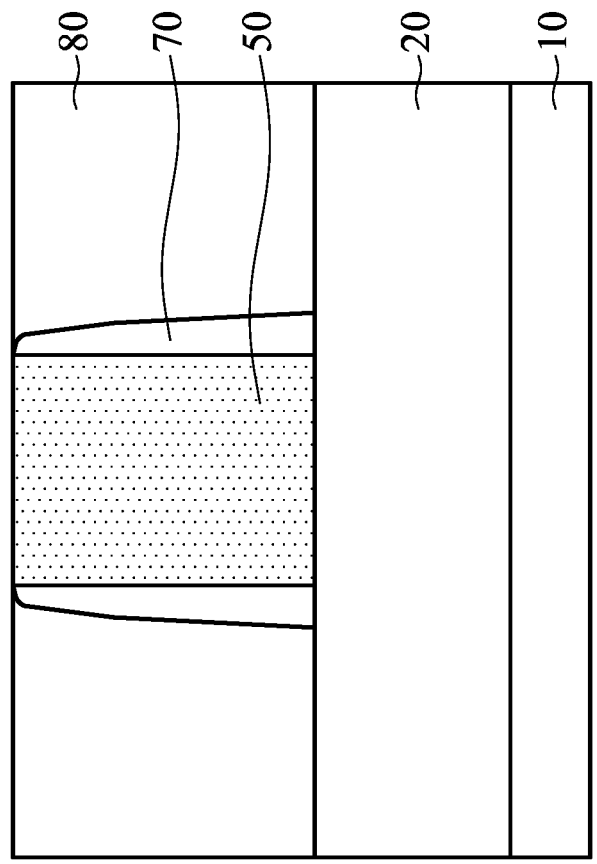
FIG. 11C shows a cross-sectional view taken along line C-C of FIG. 1 of one stage of a sequential process performed on the device of FIGS. 11A-11C.

A high-k gate dielectric layer 55 and a metal gate electrode layer 60 are subsequently formed in the gate openings 65, as shown in FIGS. 11A-11C, forming a pair of HK/MG electrode structures 52. FIG. 11A shows a cross-sectional view taken along line A-A of FIG. 1, FIG. 11B shows a cross-sectional view taken along line B-B of FIG. 1, and FIG. 11C shows a cross-sectional view taken along line C-C of FIG. 1. The HK/MG electrode structures 52 are electrically separated from each other by the intervening second insulating layer 50. In some embodiments, a portion of the first insulating layer 45 remains between the second insulating layer 50 and the metal gate electrode layer 60 (see FIGS. 13B and 13C). FIG. 11B shows the fin structure 15 with the HK/MG electrode structure 52 formed thereon taken along the length of the fin (the Y-direction). When forming the gate openings 65, the first insulating layers 45 on the walls of the dummy gate electrode structure 22 is removed in some embodiments. When the first insulating layer 45 is removed from the region directly between the pair of gate electrode structures 22, the distance between the subsequently formed HK/MG electrode structures 52 is less than the distance between the between the pair of dummy gate electrode structures 22, thus device density is increased in some embodiments of the disclosure.

In some embodiments, the high-k dielectric layer 55 includes one or more layers of a dielectric material, such as silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The high-k dielectric layer 55 may be formed by chemical vapor deposition, atomic layer deposition, or any suitable method. The thickness of the gate dielectric layer 55 is in a range from about 1 nm to about 6 nm in some embodiments. In some embodiments, an interfacial layer, such as a silicon dioxide layer, is formed between the fin structure 15 and the high-k dielectric layer 55.

The metal gate electrode layer 60 is formed on the gate dielectric layer 55. The metal gate electrode layer 60 includes one or more layers of conductive material, such as aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The metal gate electrode layer 60 may be formed by chemical vapor deposition, atomic layer deposition, physical vapor deposition (sputtering), electroplating, or other suitable method.

In certain embodiments of the present disclosure, one or more work function adjustment layers (not shown) are interposed between the gate dielectric layer 55 and the gate electrode 60. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For an nFET, one or more of TaN, TaAlC, TiN, TiC, Co, TiAl, HfTi, TiSi and TaSi is used as the work function adjustment layer, and for a pFET, one or more of TiAlC, Al, TiAl, TaN, TaAlC, TiN, TiC and Co is used as the work function adjustment layer. The work function adjustment layer may be different for nFET and pFET devices. The work function adjustment layer may be formed by atomic layer deposition, physical vapor deposition, chemical vapor deposition, e-beam evaporation, or other suitable process.

FIGS. 12A to 12H illustrate a sequential process of manufacturing a semiconductor device according to some embodiments of the disclosure. FIGS. 12A to 12D are plan views of the sequential process. FIGS. 12A, 12C, 12E, and 12G illustrate the process when an opening 40 is properly aligned with the gate electrode layer 30. FIGS. 12B, 12D, 12F, and 12H illustrate an embodiment where the opening 40 is not properly aligned with the gate electrodes. These Figures demonstrate how the present disclosure prevents bridging between adjacent gate electrodes even when the opening is not properly aligned.

Figure 12A:
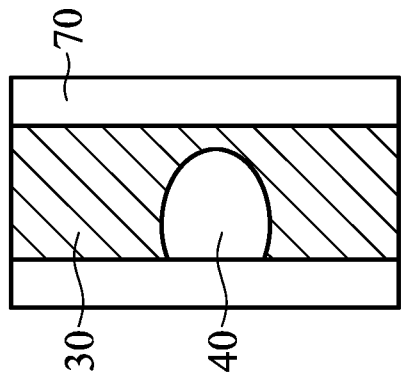
Figure 12B:
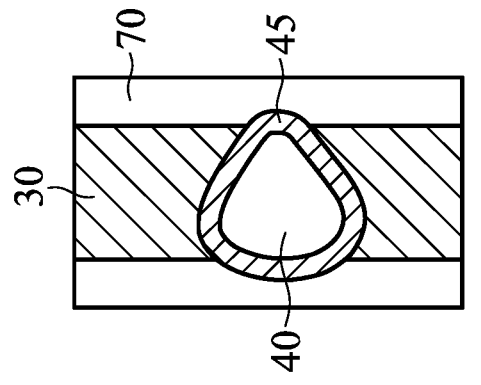

FIG. 12A shows a properly aligned opening 40 separating the pair of gate electrode layers 30. In FIG. 12B, on the other hand, the opening 40 is improperly aligned, and there is electrical bridging between the pair of gate electrode layers 30.

Figure 12C:
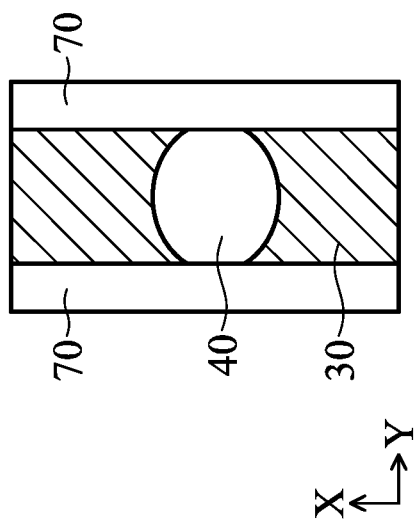
Figure 12D:
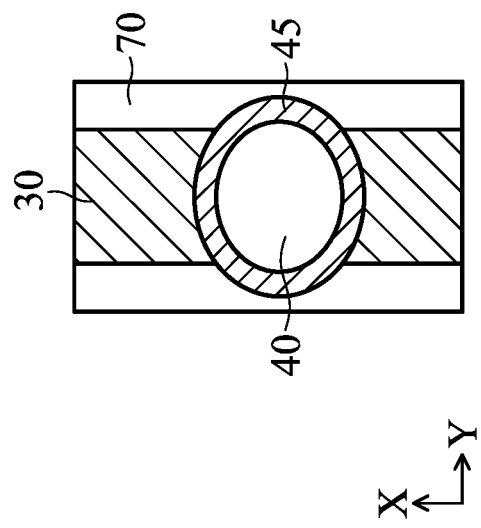

The oxidation or nitridation operation to form the first insulating layer 45 electrically insulates the pair of gate electrode layers 30, as shown in FIG. 12C. While the first insulating layer 45 may not be symmetrical in FIG. 12D as compared to FIG. 12C, it still remedies the electrical bridging between the pair of gate electrode layers 30.

As shown in FIGS. 12E and 12F, the second insulating layer 50 is deposited in the opening 40. In some embodiments, in the formation of the gate openings 65, the first insulating layer 45 is also removed in a region directly in line with the gate electrode layers 30. However, a portion of the first insulating layer 45 remains in the region between the first gate openings 65, such as between the second insulating layer 50 and the insulating sidewall spacers 70.

The HK/MG gate electrode structures are subsequently formed in the gate openings 65. As shown in FIGS. 12G and 12H the second insulating layer 50 and the first insulating layer 45 maintain the gate electrode layers 60 electrically separated from each other.

Additional embodiments of the gate electrode structure according to the present disclosure are illustrated in FIGS. 13A-13E, showing plan views of a variety of arrangements of the first and second insulating layers, 45, 50, the metal gate electrode layers 60, and the insulating sidewall spacers 70 according to embodiments of the present disclosure. Different profiles at the metal gate electrode layer 60 and first and second insulating layers 45, 50 interfaces are formed in some embodiments. The different profiles are formed by etching of the first insulating layer 45 during the polysilicon removal operation of dummy gate removal in some embodiments.

Figure 13A:
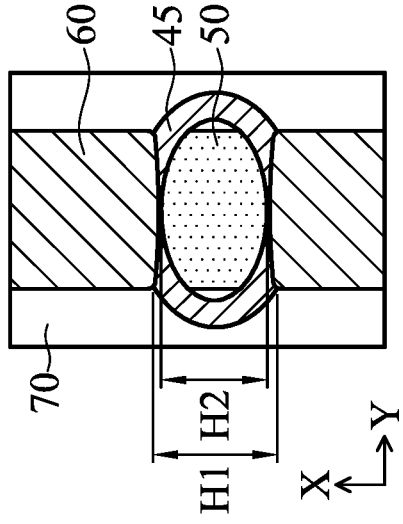
FIGS. 13A, 13B, 13C, 13D, and 13E show plan views of embodiments of semiconductor devices according to the present disclosure.

As shown in FIG. 13A, a sharp angle is formed at the interface of the metal gate electrode layer 60 and the second insulating layer 50 in some embodiments. The lengths H1 and H2 range from about 1 nm to about 200 nm, and H1<H2 in some embodiments.

Figure 13B:
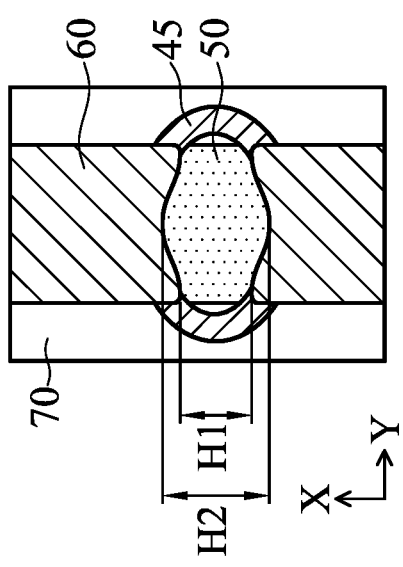

In FIG. 13B, on the other hand, squared ends of the metal gate electrode layers 60 are formed in some embodiments. The lengths H1 and H2 range from about 1 nm to about 200 nm, and H1>H2 in some embodiments.

Figure 13C:
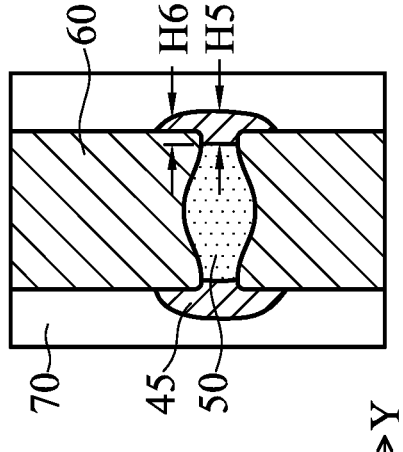
Figure 13D:
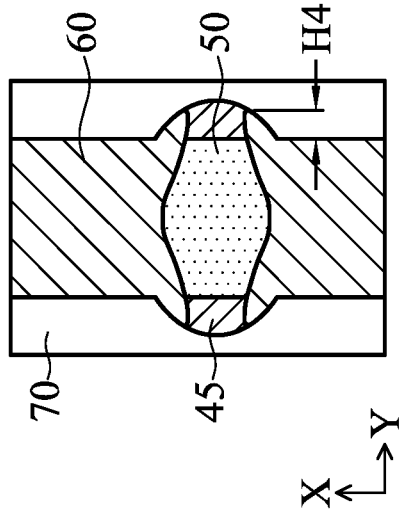

In FIG. 13C, no pull back of the first insulating layer 45 occurs during the polysilicon removal, and the thickness H3 of the first insulating layer 45 between the second insulating layer 50 and the gate electrode layer 60 is about 0.5 nm to about 50 nm. On the other hand, in FIG. 13D, pull back of the first insulating layer 45 occurred during the polysilicon removal operation and the first insulating layer 45 is removed from between the second insulating layer 50 and the gate electrode layer 60, while a portion of the first insulating layer 45 having a thickness H4 of from about 0.5 nm to about 50 nm remains between the second insulating layer 50 and the sidewall spacers 70 in some embodiments.

Figure 13E:
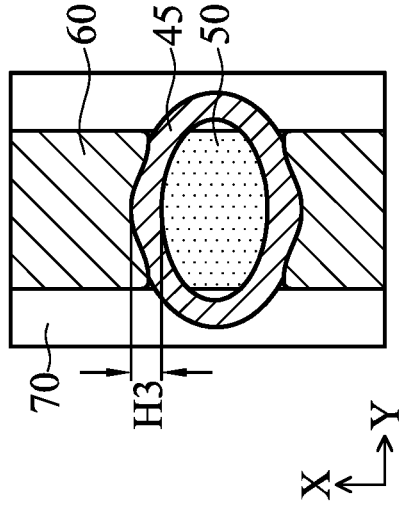

In FIG. 13E, the first insulating layer 45 is somewhat rectangular-shaped when formed, rather than round-shaped, as in FIGS. 13A-13D. After oxide etch during the polysilicon removal operation, a portion of the first insulating layer 45 remains on the sidewall spacers 70. The thickness H5 of the first insulating layer 45 between the second insulating layer 50 and the sidewall spacers 70 is about the same or slightly less than the distance H6 between the outer surface of the first insulating layer 45 overlying the metal gate electrode layer 60 and an extension of the inner surface of the first insulating layer 45 at the interface of the second insulating layer 50. In some embodiments, H6−H5<2 nm and the lengths H5 and H6 range from about 1 nm to about 200 nm.

FIGS. 14A and 14B are plan views illustrating the arrangement of devices according to embodiments of the disclosure. FIG. 14A illustrates the arrangement of the first insulating layer 45, second insulating layer 50, gate electrode layers 60, and insulating sidewall spacers 70 for a short channel device, such as a device having a channel length L1 of <100 nm. An example of a short channel device is a core memory device. In some embodiments, the short channel device has a channel length L1 of <50 nm. FIG. 14B illustrates the arrangement of the first insulating layer 45, second insulating layer 50, gate electrode layers 60, and insulating sidewall spacers 70 for a long channel device, such as a device having a channel length L2 of >100 nm. In some embodiments, the long channel device has channel length L2 of about 300 nm to about 400 nm. An example of a long channel device is an input/output device. In some embodiments, the thickness H7 of the first insulating layer 45 between the second insulating layer 50 and gate electrode layer 60 of a short channel device is 0 to about 2 nm. In some embodiments, the thickness H8 of the first insulating layer 45 between the second insulating layer 50 and gate electrode layer 60 of a long channel device is about 1 nm to about 100 nm.

Figure 15B:
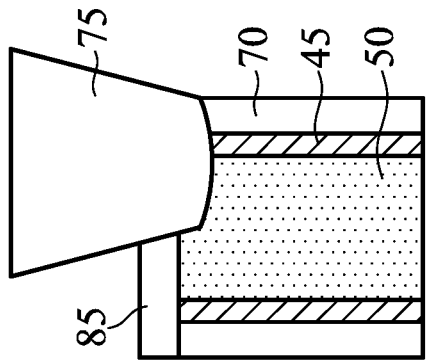
FIGS. 15A, 15B, 15C, and 15D show cross-sectional views of embodiments of semiconductor devices according to the present disclosure.
Figure 15D:
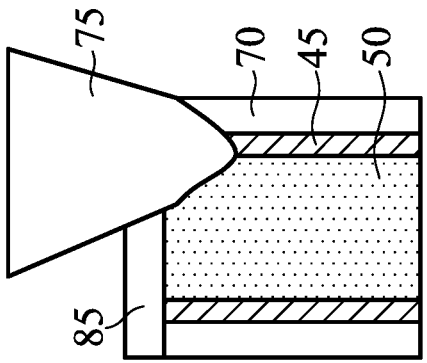
Figure 15A:
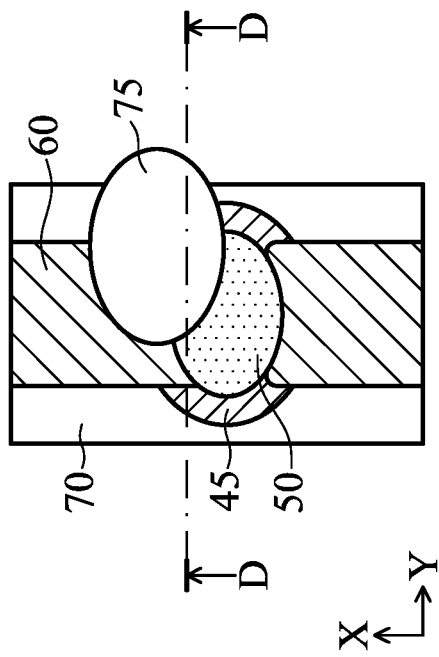
Figure 15C:
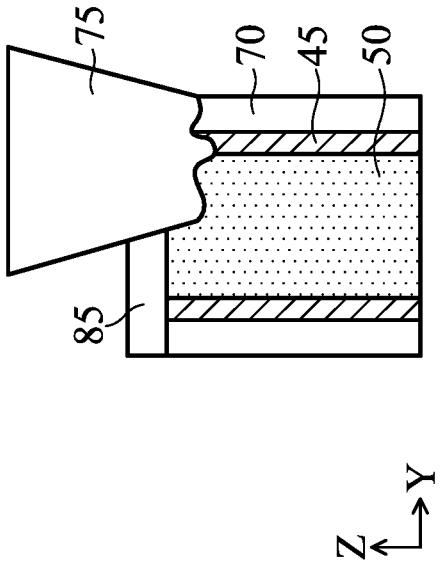

As shown in FIGS. 15A-15D, the arrangement of the first and second insulating layers 45, 50 and the etch selectivity of the layers affects the shape of subsequently formed contacts 75. The contact shape is adjusted, as necessary, in some embodiments to provide a large contact area between the gate electrode layer 60 and the contact 75. FIG. 15A is a plan view of an embodiment of the disclosure, showing the location of a contact 75. FIGS. 15B-15D are cross sectional views along line D-D showing the profile of the contact formed through an etch stop layer 85 and how the contact profile changes depending on the etch selectivity and relative thickness H3 of the first insulating layer 45 between the gate electrode layer 60 and the second insulating layer 50 (see FIG. 13C), and the thickness H4 of the first insulating layer 45 between the second insulating layer 50 and the insulating sidewall spacers 70 (see FIG. 13D). In FIG. 15B, H3=H4, while in FIG. 15C, 113>H4, and in FIG. 15D, H3>>H4 in some embodiments.

The contacts 75 may be formed by any suitable conductive material, such as a metal, including tungsten (W) in some embodiments. The conductive material may be deposited by any suitable deposition technique, including chemical vapor deposition, atomic layer deposition, electroplating, or other suitable method.

In certain embodiments of the present disclosure an unexpected decrease in the number of rejects per wafer is achieved by practicing embodiments of the present disclosure, such as performing an oxidation or nitridation treatment after a polysilicon gate electrode cut operation. For example, on a wafer including pull up gate pass gate p-type metal oxide semiconductor (PMOS) devices, the number of rejects per wafer dropped from 29 defects per wafer to no rejects detected on the wafer. In another example, on a wafer including pull down pull down n-type metal oxide semiconductor (NMOS) static random-access memory (SRAM) devices the number of rejects per wafer dropped from 58 rejects per wafer to no rejects detected on the wafer. Furthermore, on a wafer with conventional logic devices, the number of rejects dropped from 140/in$^2$ to 31/in$^2$, when practicing embodiments of the present disclosure.

Thus, manufacturing semiconductor devices according to the present disclosure provides an unexpected increase in device yield.

It will be understood that not all advantages have been necessarily discussed herein, no particular advantage is required for all embodiments or examples, and other embodiments or examples may offer different advantages.

An embodiment of the present disclosure is a method for fabricating a semiconductor device including an opening in a gate electrode layer to form two spaced apart gate electrode layers. An oxidation or nitridation treatment is performed in a region between the two spaced apart gate electrode layers. A first insulating layer is formed in the opening between the two spaced apart gate electrode layers. In an embodiment, the opening in the gate electrode includes forming a hard mask layer over the gate electrode layer, patterning the hard mask layer, and extending the pattern in the hard mask layer through the gate electrode layer. In an embodiment, the performing the oxidation or nitridation treatment in the region between the two spaced apart gate electrode layers includes applying an oxygen plasma or nitrogen plasma to the region between the two spaced apart gate electrode layers and forming a second insulating layer on sidewalls of the region between the two spaced apart gate electrode layers. In an embodiment, the oxygen plasma or nitrogen plasma is applied at a power of 0.5 kW to about 6 kW, an oxygen or nitrogen flow rate of about 100 to about 1000 sccm, and at a pressure of about 40 mTorr to about 400 mTorr. In an embodiment, the second insulating layer is formed of a material selected from the group consisting of silicon oxide, silicon nitride, silicon oxynitride, silicon carbide, silicon oxycarbide, and SiCON. In an embodiment, the forming the first insulating layer in the opening between the two spaced apart gate electrode layers includes depositing an oxide layer, nitride layer, or carbide layer in the opening. In an embodiment, the first insulating layer is formed of a material selected from the group consisting of silicon nitride, silicon oxynitride, silicon carbide, silicon oxycarbide, SiCON, and combinations thereof. In an embodiment, the insulating sidewall spacers are formed on opposing side surfaces of the gate electrode layer. In an embodiment, the gate electrode layers are dummy gate electrode layers formed of polysilicon. In an embodiment, the gate electrode layers are dummy gate electrode layers, and the method further includes after forming the first insulating layer, removing the dummy gate electrode layers and underlying dummy gate dielectric layers to form a pair of gate spaces separated by the first insulating layer, forming high-k gate dielectric layers in the pair of gate spaces, and forming metal gate electrode layers over the high-k gate dielectric layers.

Another embodiment of the present disclosure is a method for manufacturing a semiconductor device, including forming a plurality of fin structures extending along a first direction on a semiconductor substrate. An isolation insulating layer is formed around the fin structures so that a first portion of the fin structures is embedded in the isolation insulating layer and a second portion of the fin structures protrudes from the isolation insulating layer. A gate electrode structure including a gate dielectric layer and a gate electrode layer extending in a second direction substantially perpendicular to the first direction is formed over the plurality of fin structures and the isolation insulating layer. A hard mask layer is formed over the gate electrode structure. Insulating sidewall spacers are formed on opposing side surfaces of the gate electrode structure. An interlayer dielectric layer is formed over the fin structures and gate electrode structure. An opening is formed in the gate electrode structure between a pair of fin structures exposing a portion of the isolation insulating layer to form two spaced apart gate electrode structures. An oxidation or nitridation treatment is performed in a region between the two spaced apart gate electrode layers. A first insulating layer is formed in the opening between the two spaced apart gate electrode layers. In an embodiment, the forming an opening in the gate electrode includes patterning the hard mask layer and extending the pattern in the hard mask layer through the gate electrode structure. In an embodiment, the performing the oxidation or nitridation treatment in the region between the two spaced apart gate electrode layers includes applying an oxygen plasma or nitrogen plasma to the region between the two spaced apart gate electrode layers and forming a second insulating layer on sidewalls of the region between the two spaced apart gate electrode layers. In an embodiment, the oxygen plasma or nitrogen plasma is applied at a power of 0.5 kW to about 6 kW, an oxygen or nitrogen flow rate of about 100 to about 1000 sccm, and at a pressure of about 40 mTorr to about 400 mTorr. In an embodiment, the second insulating layer is formed of a material selected from the group consisting of silicon oxide, silicon nitride, silicon oxynitride, silicon carbide, silicon oxycarbide, and SiCON. In an embodiment, the forming the first insulating layer in the opening between the two spaced apart gate electrode layers includes depositing an oxide layer, nitride layer, or carbide layer in the opening. In an embodiment, the first insulating layer is formed of a material selected from the group consisting of silicon nitride, silicon oxynitride, silicon carbide, silicon oxycarbide, SiCON, and combinations thereof. In an embodiment, the gate electrode layers are dummy gate electrode layers formed of polysilicon. In an embodiment, after forming the second insulating layer, the dummy gate electrode layers and gate dielectric layers are removed to form a pair of gate spaces separated by the first insulating layer, high-k gate dielectric layers are formed in the pair of gate spaces, and metal gate electrode layers are formed over the high-k gate dielectric layers.

Another embodiment of the present disclosure is a semiconductor device including a plurality of fin structures extending in a first direction disposed on a semiconductor substrate. A lower portion of the fin structures is embedded in a first insulating layer. A first gate electrode structure and a second gate electrode structure extending in a second direction substantially perpendicular to the first direction are disposed over the plurality of fin structures and the first insulating layer. The first gate electrode structure and second gate electrode structure are spaced apart from each other and extend along a line in a same direction. First and second insulating sidewall spacers are arranged on opposing side surfaces of the first and second gate electrode structures, wherein each of the first and second insulating sidewall spacers contiguously extend along the second direction. A second insulating layer is disposed in a region between the first gate electrode structure and second gate electrode structure. The second insulating layer separates the first gate electrode structure from the second gate electrode structure. A third insulating layer is in the region between the first gate electrode structure and the second gate electrode structure. The third insulating layer is formed of a different material than the second insulating layer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   fin structures extending in a first direction disposed on a semiconductor substrate;
   a first gate electrode structure and a second gate electrode structure extending in a second direction substantially perpendicular to the first direction, each gate electrode structure disposed over at least one fin structure of the fin structures, wherein the first gate electrode structure and second gate electrode structure are spaced apart from each other and extend along a same line in a same direction;
   first and second insulating sidewall spacers arranged on opposing side surfaces of both of the first and second gate electrode structures;
   a first insulating layer disposed in a region between the first gate electrode structure and the second gate electrode structure;
   a second insulating layer disposed in the region between the first gate electrode structure and second gate electrode structure,
   wherein a length H2 of the second insulating layer between the first gate electrode structure and the second gate electrode structure is less than a length H1 of the first insulating layer between the first gate electrode structure and the second gate electrode structure in plan view.

2. The semiconductor device of claim 1, wherein the second insulating layer is formed of a material selected from the group consisting of silicon nitride, silicon oxynitride, silicon carbide, silicon oxycarbide, and SiCON.

3. The semiconductor device of claim 1, wherein the length of H1 ranges from 1 nm to 200 nm.

4. The semiconductor device of claim 1, wherein the first insulating layer and the second insulating layer are formed of different materials.

5. The semiconductor device of claim 4, wherein the first insulating layer is formed of a material selected from the group consisting of silicon dioxide, silicon oxynitride, silicon carbide, silicon oxycarbide, and SiCON.

6. The semiconductor device of claim 1, wherein the first insulating layer extends into the first and second insulating sidewall spacers as seen in plan view.

7. The semiconductor device of claim 1, wherein the first and second insulating sidewall spacers are formed of a different material than the second insulating layer.

8. The semiconductor device of claim 7, wherein the first and second insulating sidewall spacers are formed of a material selected from the group consisting of silicon carbide, silicon oxycarbide, and SiCON.

9. A semiconductor device comprising:
   a plurality of fin structures extending in a first direction disposed on a semiconductor substrate;
   a first gate electrode structure and a second gate electrode structure extending in a second direction substantially perpendicular to the first direction disposed over the plurality of fin structures, wherein the first gate electrode structure and second gate electrode structure are spaced apart from each other and extend along a line in a same direction;
   first and second insulating sidewall spacers arranged on opposing side surfaces of the first and second gate electrode structures;
   a first insulating layer disposed in a region between the first gate electrode structure and the second gate electrode structure;
   a second insulating layer disposed in the region between the first gate electrode structure and second gate electrode structure,
   wherein the first insulating layer extends from an edge portion of the second insulating layer into the first and second insulating sidewall spacers in plan view.

10. The semiconductor device of claim 9, wherein the second insulating layer is formed of a material selected from the group consisting of silicon nitride, silicon oxynitride, silicon carbide, silicon oxycarbide, and SiCON.

11. The semiconductor device of claim 9, wherein the first insulating layer and the second insulating layer are formed of different materials.

12. The semiconductor device of claim 11, wherein the first insulating layer is formed of a material selected from the group consisting of silicon dioxide, silicon oxynitride, silicon carbide, silicon oxycarbide, and SiCON.

13. The semiconductor device of claim 9, wherein the first insulating layer extends into the first and second insulating sidewall spacers as seen in plan view.

14. The semiconductor device of claim 9, wherein the first and second insulating sidewall spacers are formed of a different material than the second insulating layer.

15. The semiconductor device of claim 14, wherein the first and second insulating sidewall spacers are formed of a material selected from the group consisting of silicon carbide, silicon oxycarbide, and SiCON.

16. A semiconductor device comprising:
a first gate electrode structure disposed over a first fin structure and a second gate electrode structure disposed over a second fin structure,
wherein the first gate electrode structure and second gate electrode structure are spaced apart from each other and extend along a line in a same direction;
first and second insulating sidewall spacers arranged on opposing side surfaces of the first and second gate electrode structures;
a first insulating layer disposed in a region between the first gate electrode structure and the second gate electrode structure;
a second insulating layer disposed in the region between the first gate electrode structure and second gate electrode structure,
wherein the first insulating layer surrounds a portion of the second insulating layer and the first insulating layer extends into the first and second insulating sidewall spacers in plan view.

17. The semiconductor device of claim 16, wherein the second insulating layer is formed of a material selected from the group consisting of silicon nitride, silicon oxynitride, silicon carbide, silicon oxycarbide, and SiCON.

18. The semiconductor device of claim 16, wherein the first insulating layer and the second insulating layer are formed of different materials.

19. The semiconductor device of claim 18, wherein the first insulating layer is formed of a material selected from the group consisting of silicon dioxide, silicon oxynitride, silicon carbide, silicon oxycarbide, and SiCON.

20. The semiconductor device of claim 16, wherein the first insulating layer extends into the first and second insulating sidewall spacers as seen in plan view.

* * * * *